United States Patent
Doogue et al.

(10) Patent No.: US 10,571,301 B2
(45) Date of Patent: Feb. 25, 2020

(54) FREQUENCY OF AN OUTPUT SIGNAL OF A MAGNETIC FIELD SENSOR TO DETECT SPEED AND DIRECTION OF ANGULAR ROTATION OF A ROTATING MAGNETIC STRUCTURE OR A FAULT

(71) Applicant: Allegro MicroSystems, LLC, Manchester, NH (US)

(72) Inventors: Michael C. Doogue, Bedford, NH (US); P. Karl Scheller, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 221 days.

(21) Appl. No.: 15/655,400

(22) Filed: Jul. 20, 2017

(65) Prior Publication Data

US 2019/0025084 A1    Jan. 24, 2019

(51) Int. Cl.
| | |
|---|---|
| *G01D 5/14* | (2006.01) |
| *G01P 3/487* | (2006.01) |
| *G01R 33/07* | (2006.01) |
| *G01D 5/165* | (2006.01) |
| *G01R 33/09* | (2006.01) |
| *G01D 3/08* | (2006.01) |
| *G01P 13/04* | (2006.01) |

(52) U.S. Cl.
CPC .............. *G01D 5/145* (2013.01); *G01D 3/08* (2013.01); *G01D 5/165* (2013.01); *G01P 3/487* (2013.01); *G01P 13/045* (2013.01); *G01R 33/072* (2013.01); *G01R 33/091* (2013.01)

(58) Field of Classification Search
CPC ............................. G01D 5/145; G01P 13/045
See application file for complete search history.

(56) References Cited

U.S. PATENT DOCUMENTS

| | | |
|---|---|---|
| 6,542,847 B1 | 4/2003 | Lohberg et al. |
| 6,687,644 B1 | 2/2004 | Zinke et al. |
| 6,815,944 B2 | 11/2004 | Vig et al. |
| 7,026,808 B2 | 4/2006 | Vig et al. |
| 7,184,876 B2 | 2/2007 | Teulings et al. |
| 8,089,270 B2 * | 1/2012 | Scheller .............. G01D 5/2448 324/173 |

(Continued)

FOREIGN PATENT DOCUMENTS

| | | |
|---|---|---|
| DE | 19911774 A1 | 12/1999 |
| DE | 19634714 B4 | 8/2007 |

OTHER PUBLICATIONS

U.S. Appl. No. 15/596,514, filed May 16, 2017, Burdette et al.

(Continued)

*Primary Examiner* — Reena Aurora
(74) *Attorney, Agent, or Firm* — Daly, Crowley, Mofford & Durkee, LLP

(57) ABSTRACT

In one aspect, an integrated circuit (IC) includes a magnetic field sensor to detect speed and direction of angular rotation of a rotating magnetic structure. The magnetic field sensor includes at least two magnetic field sensing elements configured to sense changes in a magnetic field caused by rotation of the magnetic structure. The IC also includes an output port configured to provide an output signal of the magnetic field sensor. The frequency of the output signal indicates the speed and the direction or indicates a fault.

22 Claims, 26 Drawing Sheets

(56) References Cited

U.S. PATENT DOCUMENTS

| | | |
|---|---|---|
| 8,624,588 B2 | 1/2014 | Vig et al. |
| 8,860,404 B2 | 10/2014 | Dwyer et al. |
| 8,994,369 B2 | 3/2015 | Vig et al. |
| 9,068,859 B2 | 6/2015 | Dwyer et al. |
| 9,151,771 B2 | 10/2015 | Vig et al. |
| 9,222,990 B2 | 12/2015 | Dwyer et al. |
| 9,664,748 B2 | 5/2017 | Friedrich et al. |
| 2015/0022187 A1* | 1/2015 | Taylor ............ G01B 7/146 324/207.2 |
| 2017/0219662 A1 | 8/2017 | Prentice et al. |

OTHER PUBLICATIONS

U.S. Appl. No. 15/350,400, filed Nov. 14, 2016, Fernandez.
U.S. Appl. No. 62/384,781, filed Sep. 8, 2016, Prentice et al.
Datasheet of Allegro MicroSystems, LLC for A3211 and A3212 "Micropower, Ultrasensitive Hall-Effect Switches" Feb. 27, 2017; 13 pages.
Datasheet of Allegro MicroSystems, LLC for A1230 "Ultra-Sensitive Dual-Channel Quadrature Hall-Effect Bipolar Switch" 2016; 17 pages.
Datasheet of Allegro MicroSystems, Inc. For A1140, A1142, and A1143 "Sensitive Two-Wire Chopper-Stabilized Unipolar Hall-Effect Switches" 2004-2010; 15 pages.
Datasheet of Allegro MicroSystems, LLC for A3425 "Ultra-Sensitive Dual-Channel Quadrature Hall-Effect Bipolar Switch" 2005-2010; 21 pages.
Product Information of Allegro MicroSystems, LLC "Ring Magnet Speed Sensing for Electronic Power Steering" 2009; 4 pages.

\* cited by examiner

| Analog Mux: | Mux Output | Input S1 S2 | Mux Input |
|---|---|---|---|
| If no Fault | Filter out | 0   0 | A |
| If Fault (Lo freq) | $V_{flow}$ | 0   1 | B |
| If Fault (hi freq) | $V_{fhi}$ | 1   0 | C |

| Condition | Analog Mux Output | Input $S_1$ $S_2$ |
|---|---|---|
| If Fault (Lo freq) | $V_{flow}$ | 0 0 |
| If Fault (Med freq) | $V_{fmed}$ | 0 1 |
| If Direction 2 | $V_{dir2}$ | 1 0 |
| If Fault (hi freq) | $V_{fhi}$ | 1 1 |

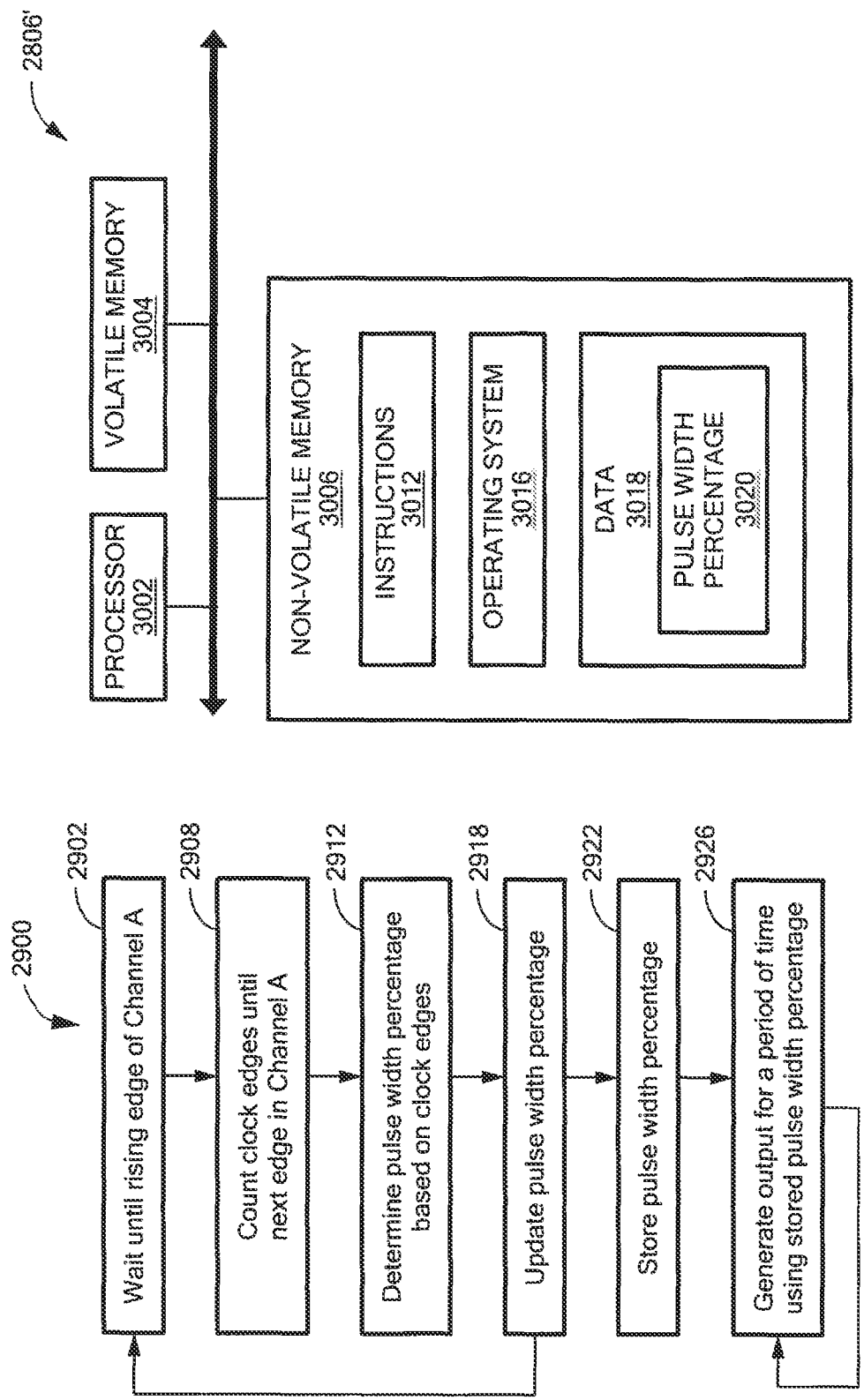

FREQUENCY OF AN OUTPUT SIGNAL OF A MAGNETIC FIELD SENSOR TO DETECT SPEED AND DIRECTION OF ANGULAR ROTATION OF A ROTATING MAGNETIC STRUCTURE OR A FAULT

BACKGROUND

Traditionally, a Hall effect sensor with two Hall elements and with dual outputs in quadrature will switch on or off in the presence or absence of a magnetic field of sufficient strength to provide rotational speed and rotational direction information. The lead or lag switching of either Hall element, compared to the other Hall element is used to determine the direction rotation of a ring magnet. In common solutions that employ speed and direction sensing using Hall latches, two Hall sensor output nodes or signals are required (i.e., two Hall sensor outputs or one Hall sensor output and a direction signal).

SUMMARY

In one aspect, an integrated circuit (IC) includes a magnetic field sensor to detect speed and direction of angular rotation of a rotating magnetic structure. The magnetic field sensor includes at least two magnetic field sensing elements configured to sense changes in a magnetic field caused by rotation of the magnetic structure. The IC also includes an output port configured to provide an output signal of the magnetic field sensor. The frequency of the output signal indicates the speed and the direction or indicates a fault.

In another aspect, an IC includes a magnetic field sensor means to detect speed and direction of angular rotation of a rotating magnetic structure. The magnetic field sensor means includes a means to sense changes in a magnetic field caused by rotation of the magnetic structure. The IC also includes an output port configured to provide an output signal of the magnetic field sensor means. The frequency of the output signal indicates the speed and the direction or indicating a fault.

DESCRIPTION OF THE DRAWINGS

FIG. 29 is a flowchart of an example of a process to generate a PWM output.

FIG. 30 is a block diagram of an example of digital circuitry to perform the process in FIG. 29.

DETAIL DESCRIPTION

Figure 1A:
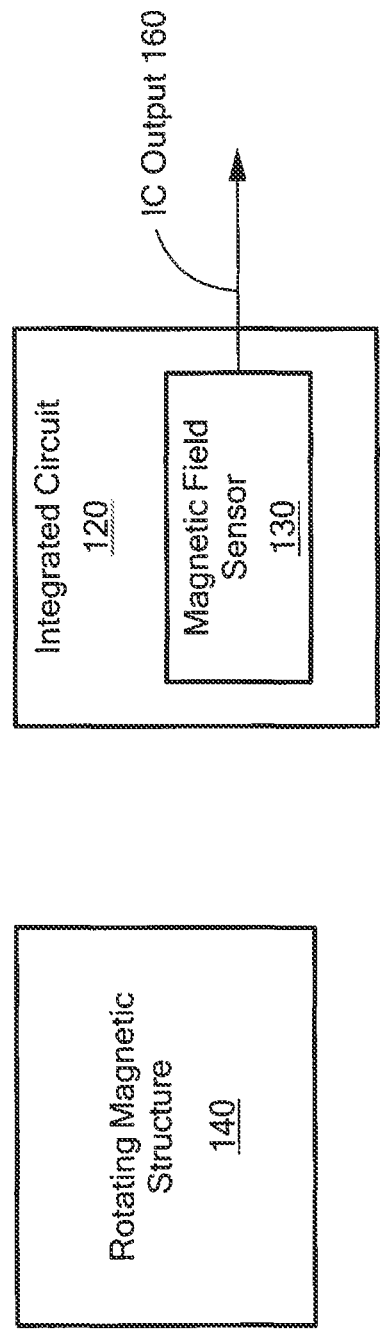
FIG. 1A is a block diagram of an example of an integrated circuit (IC) and a rotating magnetic structure.

Described herein are techniques to provide a signal indicating a speed of a rotating magnetic structure, a direction of angular rotation of the magnetic structure and/or one or more faults. Unlike traditional sensors, the sensor described herein provides the speed of the rotating magnetic structure, the direction of angular rotation of the magnetic structure and/or the one or more faults using a two-wire output.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, a fault may include any condition that identifies an error or diagnostic condition. A fault may include but is not limited to a loose wire, a temperature of an integrated circuit being too hot or too cold, an air gap between a magnet and a sensor being too big or too small, a component (e.g., an oscillator, a regulator and so forth) performing out of specification.

Figure 1B:
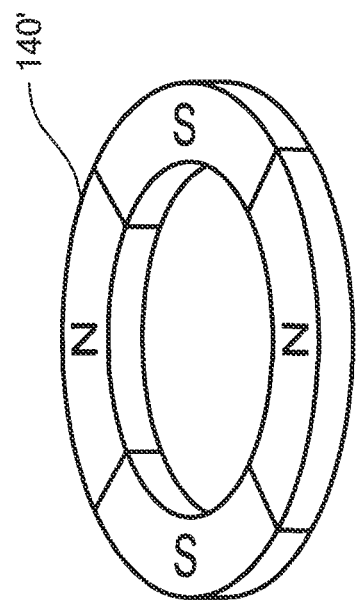
FIG. 1B is diagram of an example of the rotating magnetic structure.

Referring to FIGS. 1A and 1B, an example of an integrated circuit (IC) to detect speed and direction of angular rotation of a rotating magnetic structure is an IC 120. The IC 120 includes a magnetic field sensor 130 that detects a speed and a direction of angular rotation of a rotating magnetic structure 140 and provides an output signal 160 indicating the speed of the rotating magnetic structure 140, the direction of angular rotation of the magnetic structure 140 and/or one or more faults. In one example, a rotating magnetic structure 140 is a ring magnet 140'.

Figure 2:
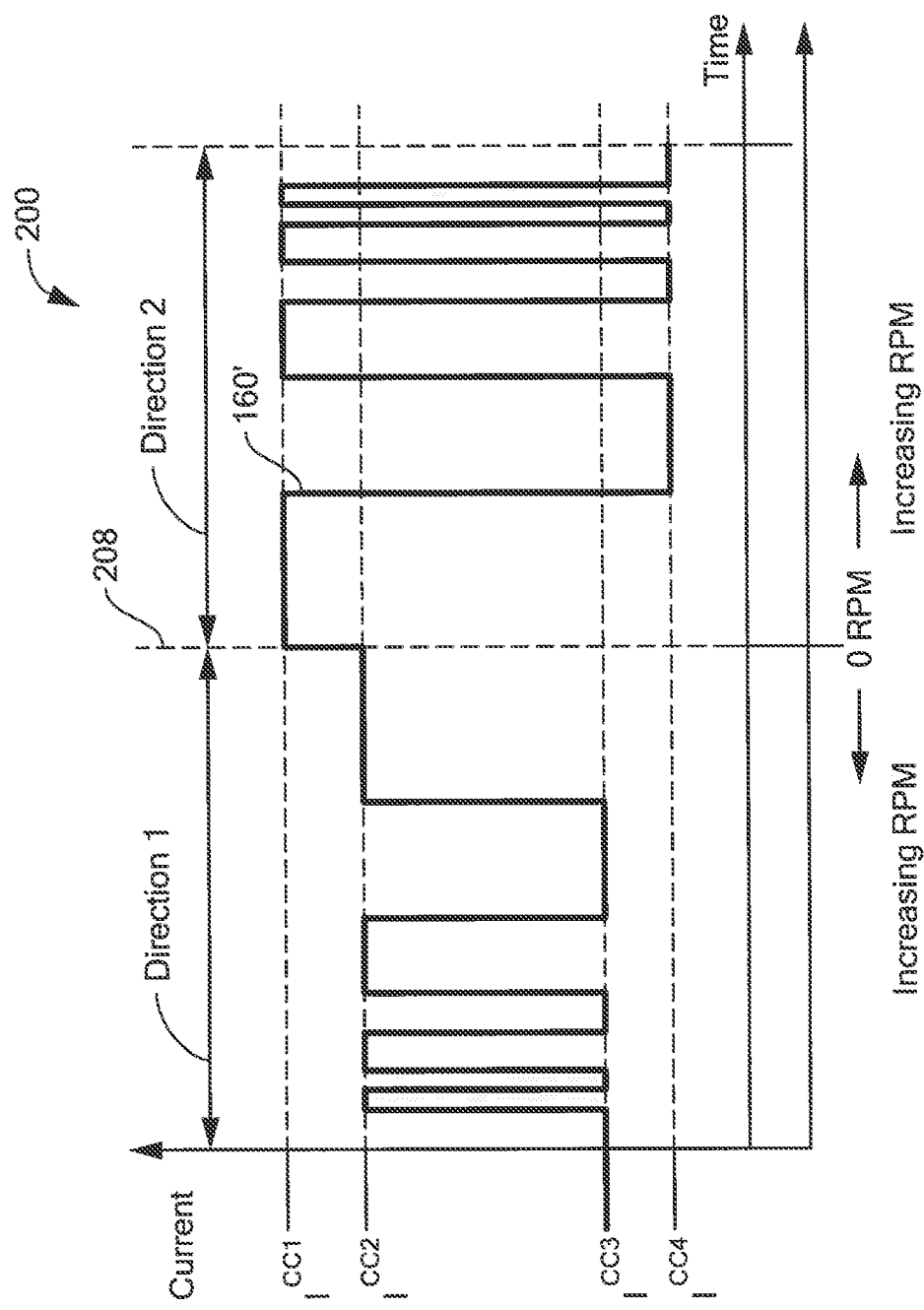
FIG. 2 is a graph of an example of an output signal of the IC of FIG. 1.

Referring to FIG. 2, in one example, the output signal 160 of the IC 120 may be an output current signal, Iout 160' which indicates the speed of the rotating magnetic structure 140 and the direction of angular rotation of the magnetic structure 140. In one example, the Iout 160' is a current signal that may be at one of four current levels, $I_{CC1}$, $I_{CC2}$, $I_{CC3}$ and $I_{CC4}$. In one example, when the Iout 160' alternates between $I_{CC2}$ and $I_{CC3}$, the rotating magnetic structure 140 is moving in direction 1 (e.g., either clockwise or counter clockwise) and when the Iout 160' alternates between $I_{CC1}$ and $I_{CC4}$, the rotating magnetic structure 140 is moving in direction 2, opposite direction 1. The faster the Iout 160' transitions between $I_{CC2}$ and $I_{CC3}$ (i.e., frequency) or the faster the Iout 160' transitions between $I_{CC1}$ and $I_{CC4}$ (i.e., frequency) the faster the speed the magnetic rotating structure 140 is turning.

Figure 3:
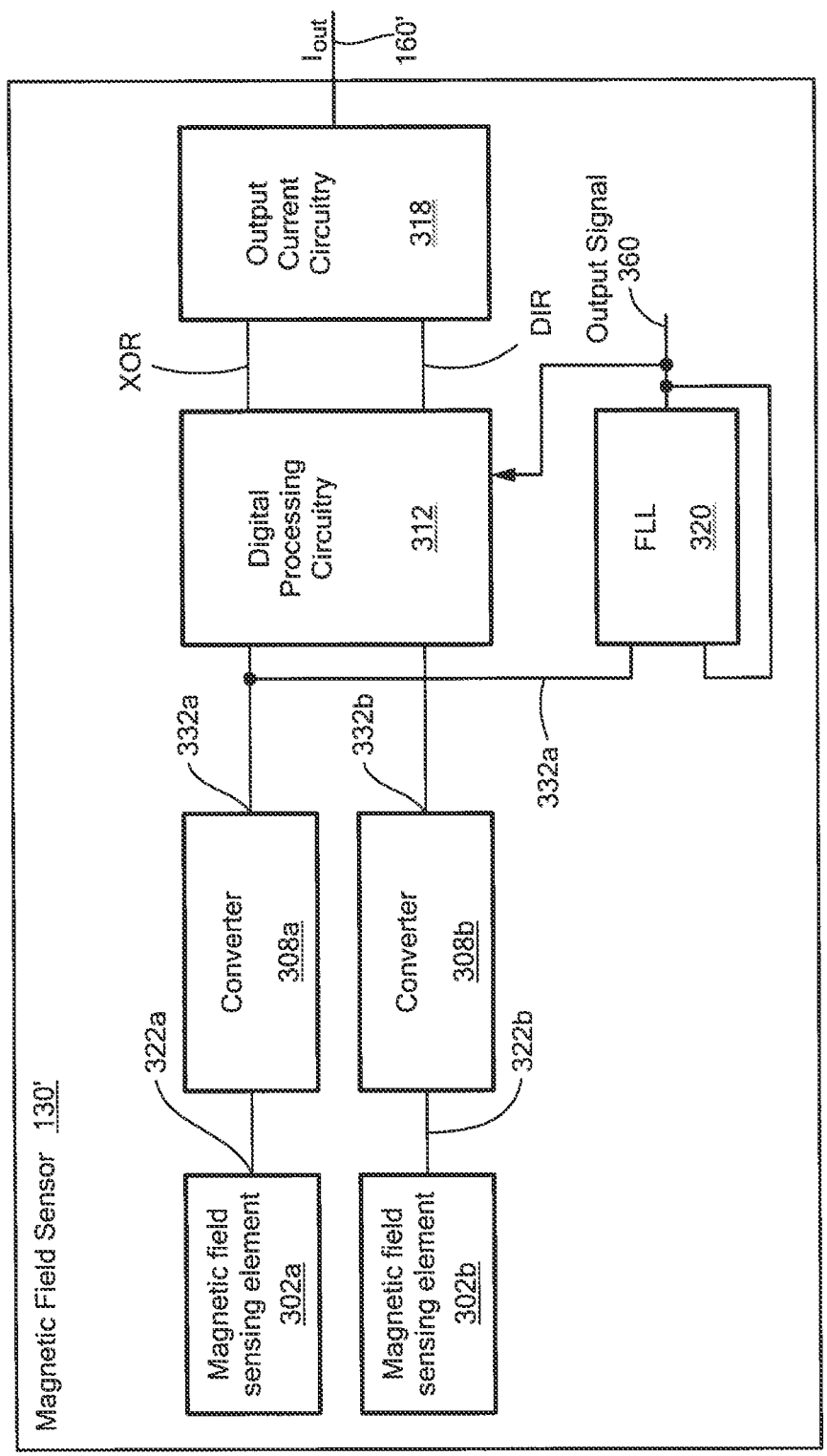
FIG. 3 is block diagram of an example of a magnetic field sensor.

Referring to FIG. 3, one example of the magnetic field sensor 130 is a magnetic field sensor 130'. The magnetic field sensor 130' includes a magnetic field sensing element 302a, a magnetic field sensing element 302b, a converter 308a, a converter 308b, a digital processing circuitry 312, an output current circuitry 318 and a frequency-locked loop (FLL) 320.

The magnetic field sensing element 302a sends an analog signal 322a based on the magnetic field sensed from the rotating magnetic structure 140 to the converter 308a, which provides a digital signal 332a to the digital processing circuitry 312 and the FLL 320. As used herein, these components are part of a Channel A.

The magnetic field sensing element 302b sends an analog signal 322b based on the magnetic field sensed from the rotating magnetic structure 140 to the converter 308b, which provides a digital signal 332b to the digital processing circuitry 312 and the FLL 320. As used herein, these components are part of a Channel B.

Figure 4A:
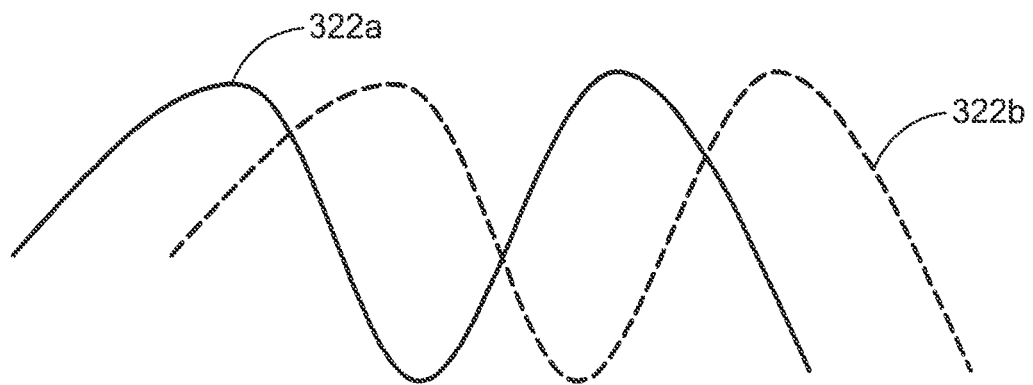
FIG. 4A are waveforms of examples of outputs of two magnetic field sensing elements.
Figure 4B:
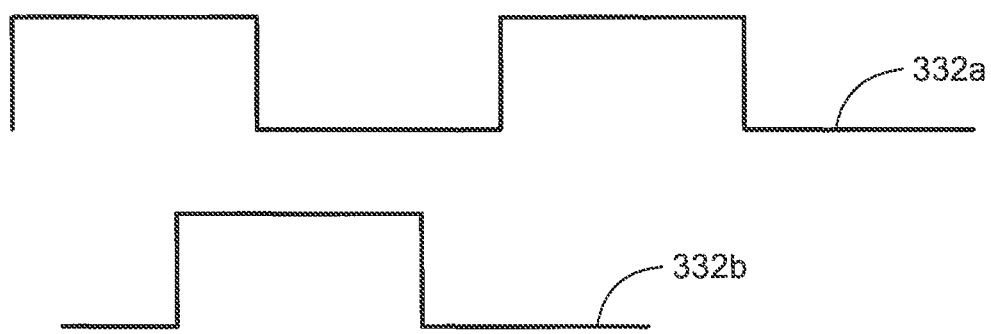
FIG. 4B are waveforms of examples of outputs of two magnetic field sensing elements after a respective converter.

FIG. 4A depicts an example of analog signals 322a, 322b. FIG. 4B depicts an example of digital signals 332a, 332b.

Referring back to FIG. 3, the digital processing circuitry 312 receives an output signal 360 from FLL 320 along with signals 332a, 332b and provides a direction signal, DIR, which indicates a direction of angular rotation of the rotating magnetic structure 140 and a signal, XOR to the output current circuitry 318. The output current circuitry 318 provides the IC output signal 160'.

In one example, the XOR signal is like an "edge stripped signal", which for every rising and falling edge of a signal, the XOR signal has a rising edge that conveys the information that channel A or B signal changed state. In one embodiment, the XOR signal will have a state transition for every rising and falling edge of signal A and B. Every edge of signal A and B will cause the XOR signal to change state, so that the signal XOR is a logic signal that gives a summary of all the magnetic switchpoints of both logic signals/channels.

Figure 5:
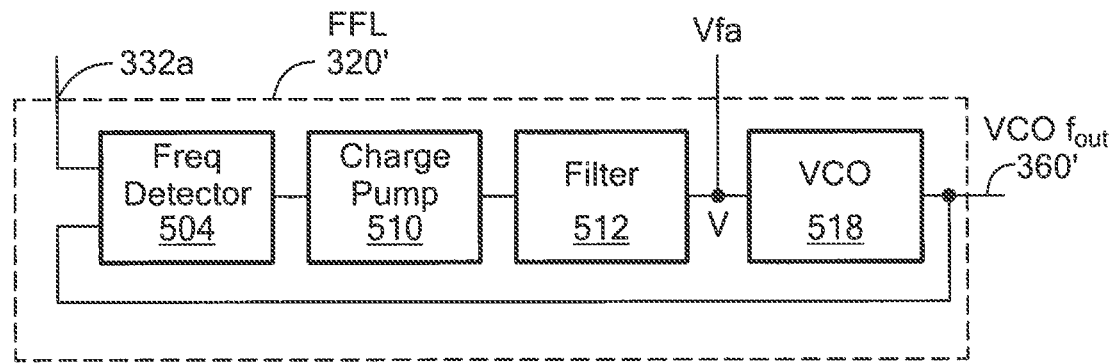
FIG. 5 is block diagram of an example of a frequency-locked loop (FLL).

Referring to FIG. 5, an example of the FLL 320 is an FLL 320'. The FLL 320' includes voltage-controlled oscillator (VCO) 518, which generated the output signal 360 as a frequency signal, VCO fout 360'. The FLL 320' further includes a frequency detector 504 that receives the digital signal 332a and the output signal 360 of the FLL 320', a charge pump 510 and a filter 512. In one example, a signal provided by the filter 512 is a voltage signal Vfa. As described further herein, the voltage Vfa may be used in one or more embodiments (see, for example, FIG. 24).

Figure 6:
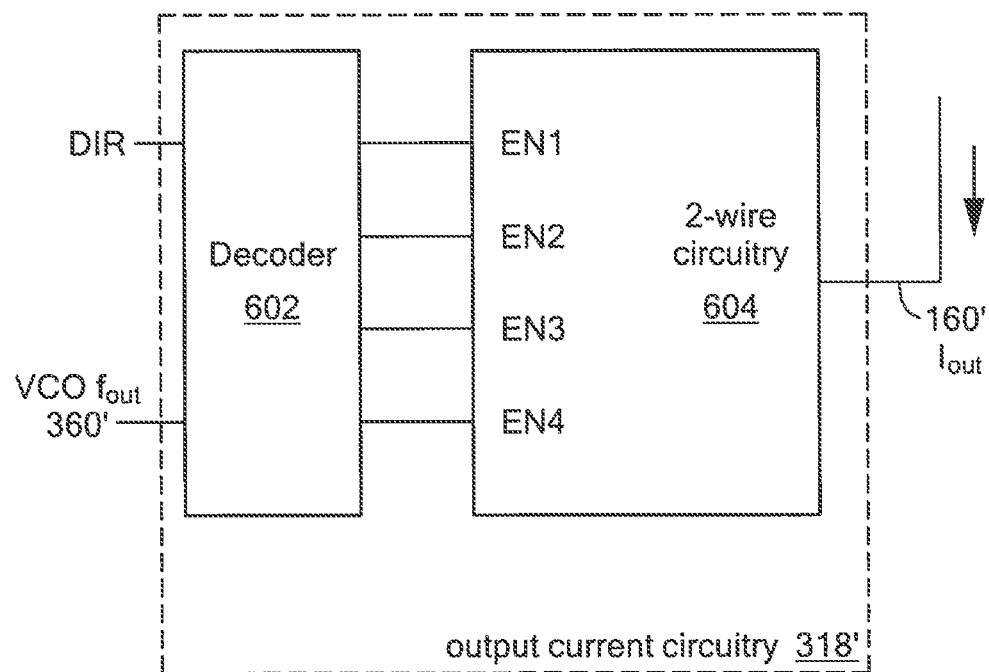
FIG. 6 is block diagram of an example of output current circuitry.

Referring to FIG. 6, an example of the output current circuitry 318 is an output current circuitry 318'. The output current circuitry 318 includes a decoder 602 and two-wire circuitry 604. The decoder 602 receives the signal, VCO fout 360', and the signal DIR. The decoder 602 provides one of four signals (e.g., a signal EN1, a signal EN2, a signal EN3 and a signal EN4) to the two-wire circuitry 604. Based on the signal received (i.e., either EN1, EN2, EN3 or EN4), the two-wire circuitry 604 generates the output signal 160'.

Figure 7:
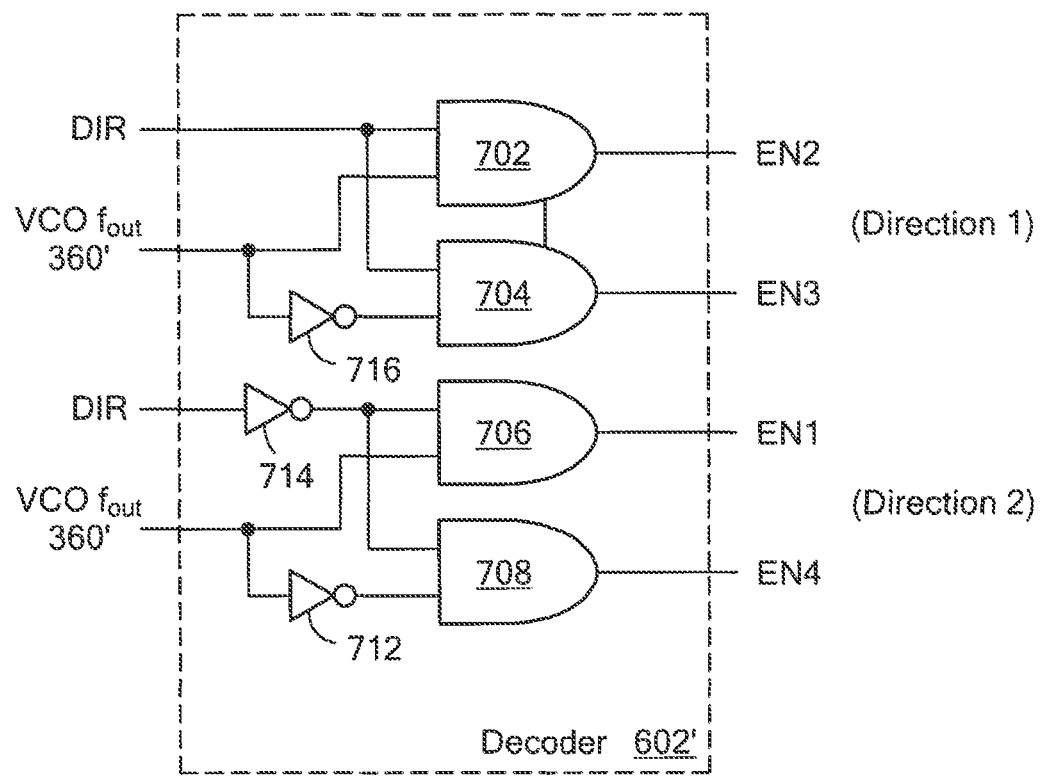
FIG. 7 is a logic diagram of an example of a decoder.

Referring to FIG. 7, an example of the decoder 602 (FIG. 6) is a decoder 602'. The decoder 602' includes AND gates 702, 704, 706, 708. The AND gate 702 receives the VCO fout 360' and the signal DIR and the AND gate 702 outputs the signal EN2.

The AND gate 704 receives an inverted signal of the VCO fout signal 360', which is inverted by the inverter 716 and the signal DIR and the AND gate 704 outputs the signal EN3. When enabled signal EN1 or signal EN3 indicates a direction 1 rotation of the rotating magnet structure 140 (FIG. 1A).

The AND gate 706 receives the VCO fout 360' and an inverted signal of the signal DIR, which is inverted by the inverter 714 and the AND gate 706 outputs the signal EN1. The AND gate 708 receives an inverted signal of the VCO fout signal 360', which is inverted by the inverter 712 and the inverted signal of the signal DIR and the AND gate 708 outputs the signal EN4. When enabled, signal EN2 or signal EN4 indicates a direction 2 rotation of the rotating magnet structure 140 (FIG. 1A).

Figure 8A:
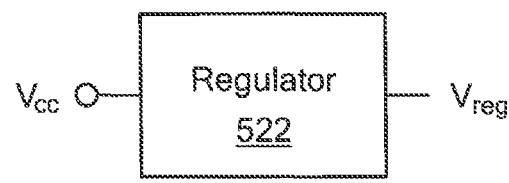
FIG. 8A is block diagram of an example of a voltage regulator.
Figure 8B:
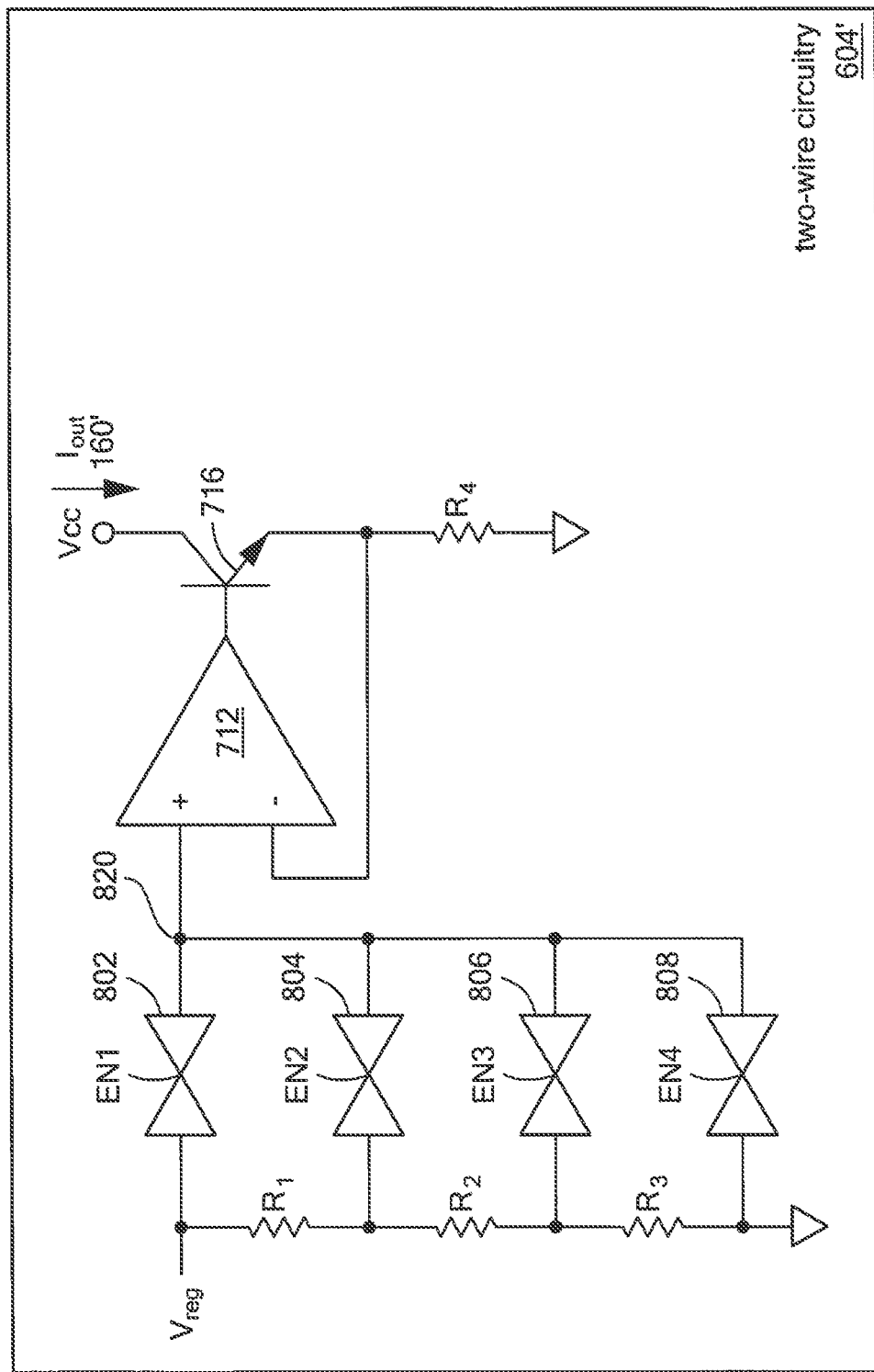
FIG. 8B is circuit diagram of an example of a two-wire circuitry.

Referring to FIGS. 8A and 8B, a regulator 522 provides a regulated voltage, Vreg from a supply voltage Vcc. An example of a two-wire circuitry 604 is the two-wire circuitry 604'. The two-circuitry includes switches 802, 804, 806, 808 that form a voltage divider with resistors $R_1$, $R_2$, $R_3$, which provides a signal 820 to a first terminal of an operational amplifier 712. The amplifier 712h provides an output signal to a base of a transistor 716. In one example, the switch 802 is closed when enabled by the signal EN1, the switch 804 is closed when enabled by the signal EN2, the switch 806 is closed when enabled by the signal EN3 and the switch 808 is closed when enabled by the signal EN4. In one example, only one of the signals EN1, EN2, EN3 or EN4 is enabled at a time.

The drain of the transistor is connected to a supply voltage $V_{cc}$ and receives the output current Iout 160'. The drain of the transistor 716 is connected to a second terminal of the operational amplifier 712 and to a resistor $R_4$ and ground.

The current the signal 820 depends on which of the signals, EN1, EN2, EN3 or EN4 is enabled. In one particular example, when EN1 is enabled, the switch 802 is closed and a 15 mA current is supplied in the signal 820; when EN2 is enabled, the switch 804 is closed and a 11 mA current is supplied in signal 820; when EN3 is enabled, the switch 806 is closed and a 4 mA current is supplied in the signal 820; and when EN4 is enabled, the switch 808 is closed and no current is supplied in the signal 820.

Figure 9:
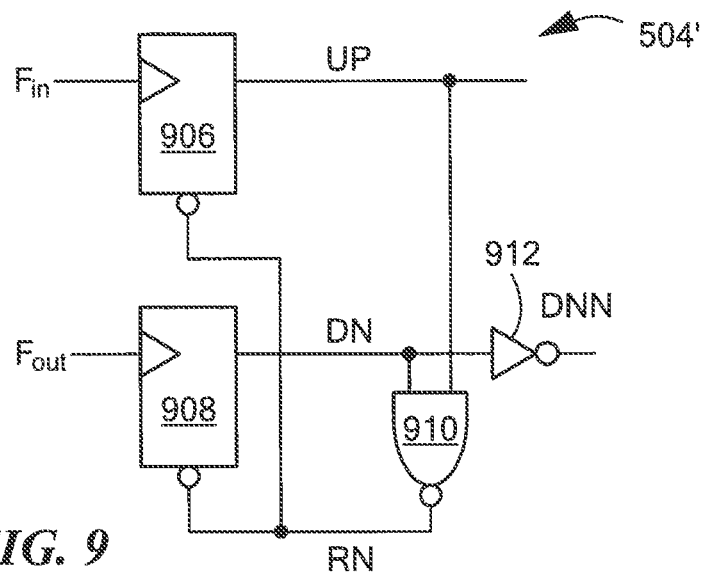
FIG. 9 is a logic diagram of an example of a frequency detector.

Referring to FIG. 9, one example of the frequency detector 504 is a frequency detector 504'. The frequency detector 504' includes a flip-flop 906 that receives a clock signal, Fin and a flip-flop 908 that receives a clock signal, Fout.

A signal, UP is a first output of the flip-flop 906 and a first output of the frequency detector 504'. A signal DN is an output of the flip-flop 908. The signal DN is inverted by an inverter 912 to produce a second output signal, DNN of the frequency detector 504'.

The frequency detector 504' also includes a NAND gate 910, which receives the signal DN as a first input and receives the signal UP as a second input to produce a signal RN. The signal, RN is provided to clear (CLR) inputs of the flip-flops 906, 908.

Figure 10:
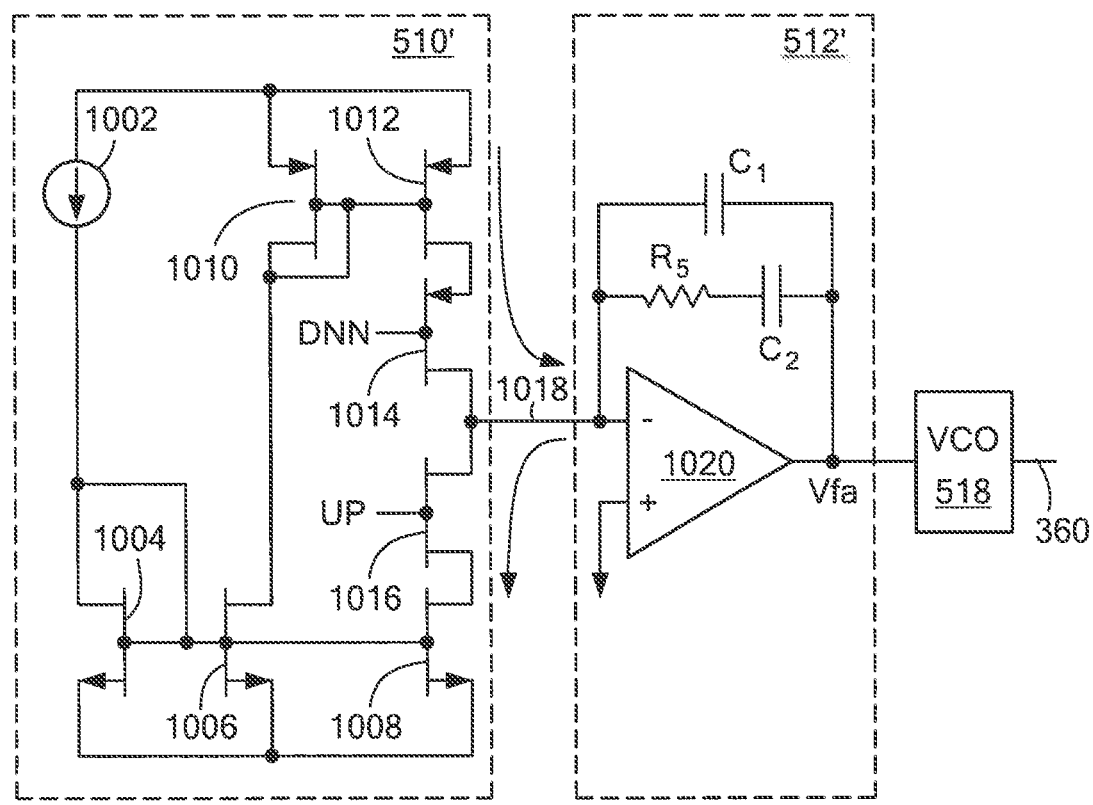
FIG. 10 is circuit diagram of an example of a charge pump and a filter.

Referring to FIG. 10, in one example the charge pump 510 may be the charge pump 510' and an example of the filter 512 is a filter 512'. The charge pump 510' includes a current source 1002, NMOS transistors 1004, 1006, 1008, 1016 and PMOS transistors 1010, 1012, 1014. The current source 1002 is connected to the gates of the NMOS transistors 1004, 1006, 1008 and the drain of NMOS transistor 1004 at one end and to the sources of the PMOS transistors 1010, 1012 at the other end. The sources of the NMOS transistors 1004, 1106, 1008 are connected to ground.

The gates of the PMOS transistors 1010, 1012 are connected. The gate and drain of the PMOS transistor 1010 are tied to the drain of the NMOS transistor 1006. The drain of the PMOS transistor 1012 is connected to the source of the PMOS transistor 1014. The source of the NMOS transistor 1014 is connected to the drain of the NMOS transistor 1008.

The signal, DNN from the frequency detector 504' is connected to the gate of the PMOS transistor 1014 and the signal, UP from the frequency detector 504' is connected to the gate of the NMOS transistor 1016. The drain of the PMOS transistor 1014 is connected to the drain of the NMOS transistor 1016, which provides a signal 1018 to the filter 512'.

The filter 512' includes an operational amplifier 1020 that receives the signal 1018 from the charge pump 510' at a first input and a second input of the operational amplifier 1020 is connected to ground. The filter 512' include a capacitor $C_1$ connected in parallel with a resistor $R_5$ and a capacitor $C_2$, which are connected in parallel with the operational amplifier 1020. The operational amplifier 1020 provides the signal Vfa to the VCO 518.

Figure 11:
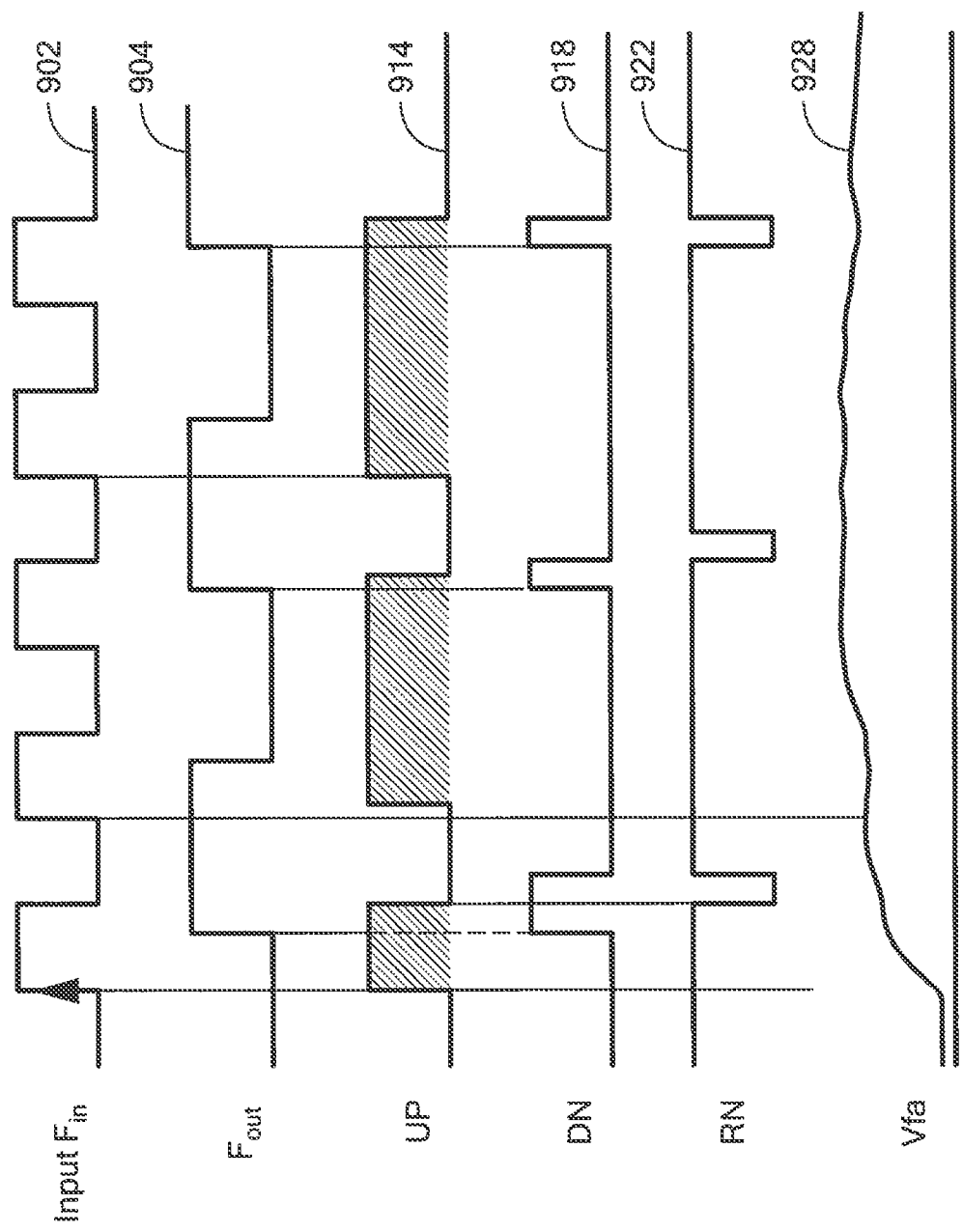
FIG. 11 is a graph of examples of waveforms of signals used in FIGS. 9 and 10.

FIG. 11 includes example waveforms using the circuits described in FIGS. 9 and 10. For example, example waveforms of the signals Fin, Fout, UP, DN, RN and Vfa are signals are waveforms Fin 902, Fout 904, UP 914, DN 918, RN 922 and Vfa, respectively.

Figure 12A:
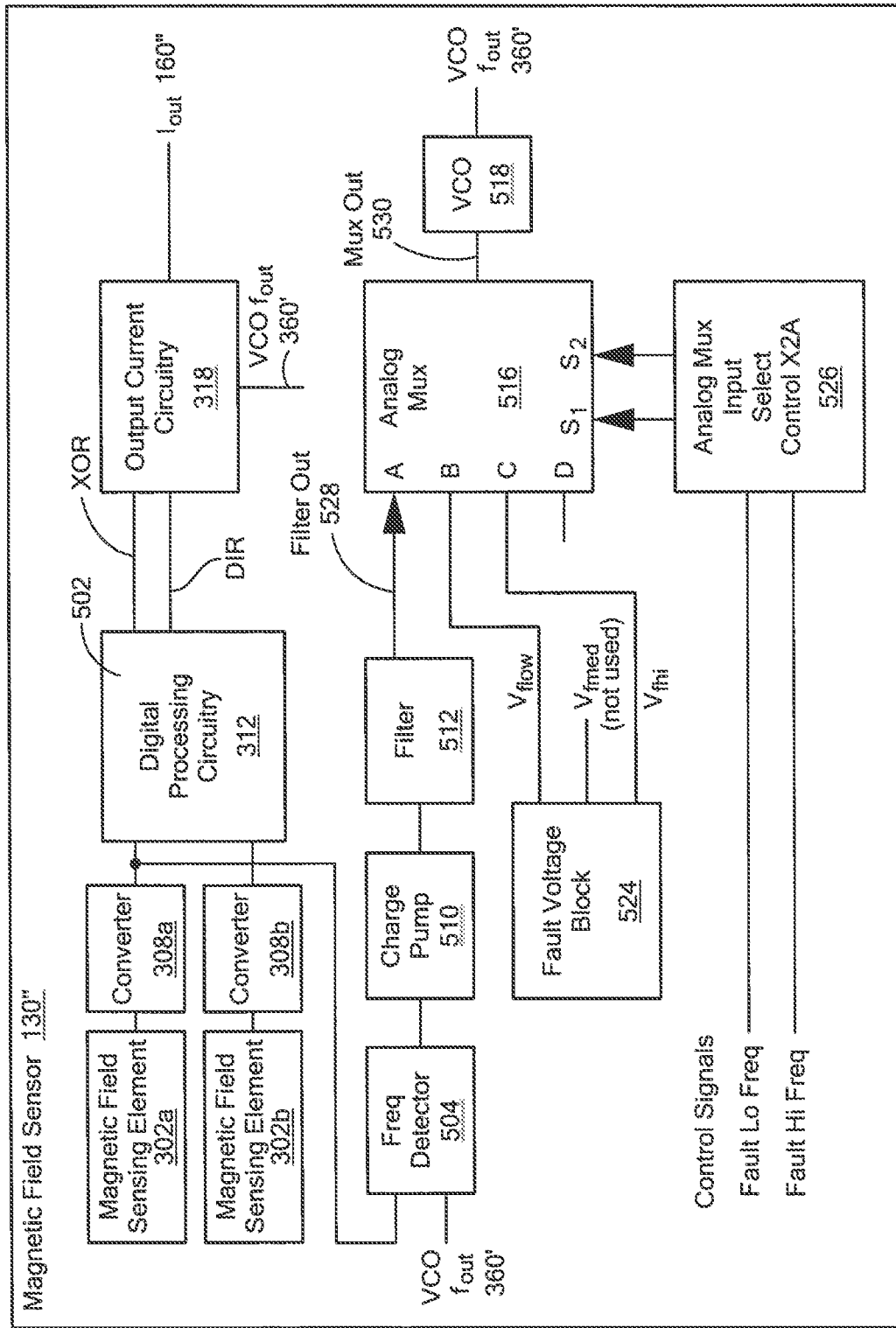
FIG. 12A is a block diagram of another example of the magnetic field sensor.
Figure 12B:
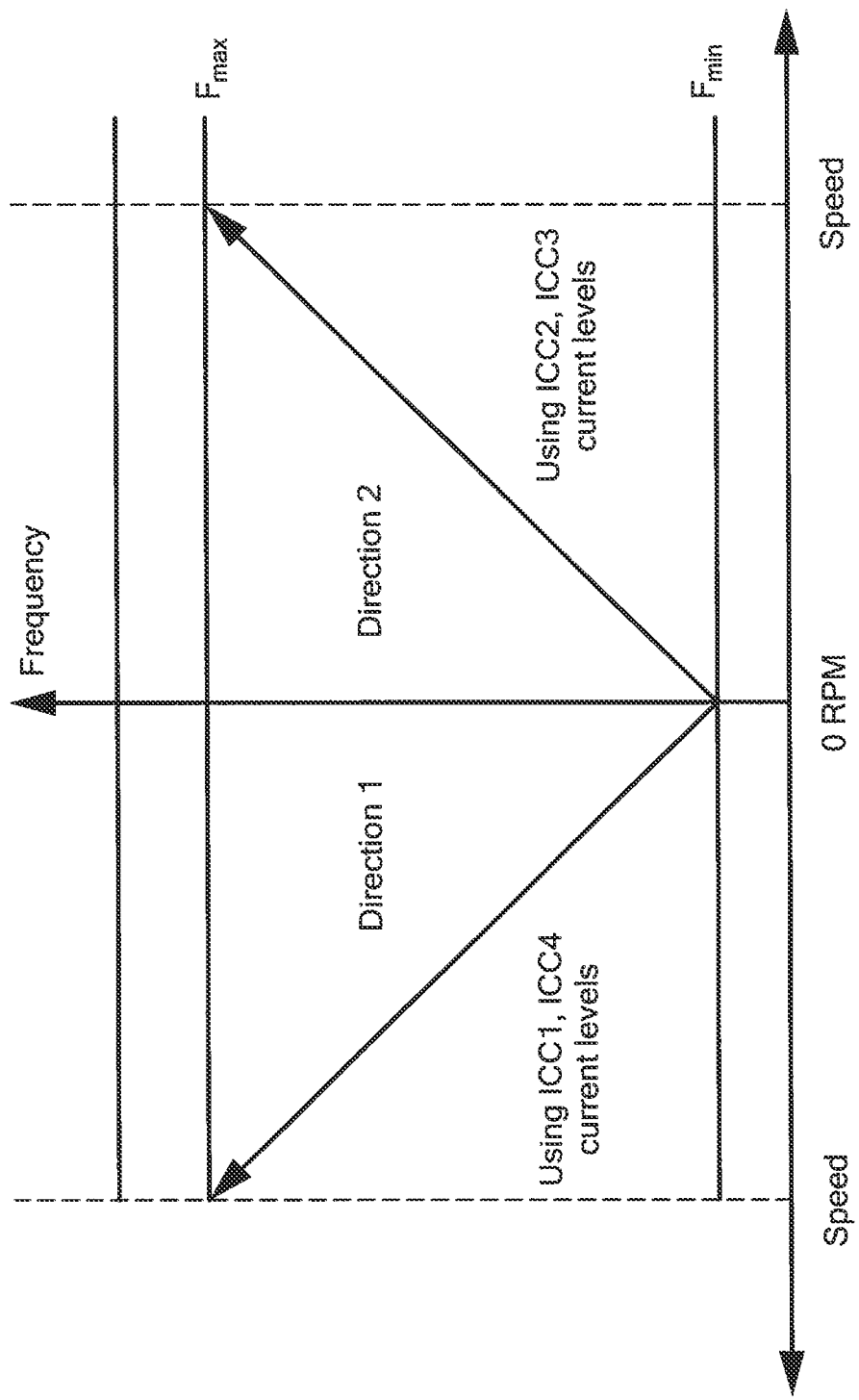
FIG. 12B is a graph of an example of frequency of an output signal to the magnetic field sensor of FIG. 12A.

Referring to FIGS. 12A and 12B, another example of the magnetic sensor 130 is a magnetic field sensor 130". The magnetic field sensor 130" generates an output signal Iout 160". The output signal Iout 160" may be used to provide the angular direction of a rotating magnet structure 140 (FIG. 1A) and one of a speed of rotation of the rotating magnet structure 140 or a fault (e.g., a fault in the IC 120 (FIG. 1)). In one example, the output signal Iout 160" may vary between four current levels (e.g., $I_{CC1}$, $I_{CC2}$, $I_{CC3}$ or $I_{CC4}$). In one particular example, when the output signal Iout 160" alternates between current levels $I_{CC1}$, $I_{CC4}$, may indicate that the rotating magnet 140 is rotating in a first direction (direction 1); and when the output current signal Iout 160" alternates between current levels $I_{CC2}$, $I_{CC3}$, may indicate that the rotating magnet 140 is rotating in a second direction (direction 2) opposite the first direction.

In one example, a frequency of the output signal Iout 160" between Fmax and Fmin correlates to the speed of rotation of the rotating magnet structure 140 (FIG. 1). A frequency of the output signal Iout 160" above Fmax or below Fmin indicates that there is a fault. For example, the IC 120 is overheating.

In one example, the magnetic field sensor 130" includes the magnetic field sensing elements 302a, 302b, the converters 308a, 308b, the digital processing circuitry 312 and the output current circuitry 318 similar to the magnetic field sensor 130'. In a further example, the magnetic field sensor 130" also includes the frequency detector 504, the charge pump 510, the filter 512 and the VCO 518. An output of the VCO 518 is the VCO fout 360'.

Unlike magnetic field sensor 130', magnetic field sensor 130" further includes an analog multiplexor 516 between the filter 512 and the VCO 518. In one example, the analog multiplexor 516 is a 4:1 multiplexor having input ports A, B, C, D.

The filter 512 provides an output signal, filter out 528, to the port A of the analog multiplexor 516. The analog multiplexor 516 is also configured to receive signals from a fault voltage block 524 and an analog multiplexor input select control 526 and is further configured to provide an output signal, mux out 530, to the VCO 518.

For example, the fault voltage block 524 provides a signal, Vflow to the port B of the analog multiplexor 516 and a signal, Vfhi to the port C of the analog multiplexor 516. A signal, Vfmed is not provided to the analog multiplexor 516 in this embodiment. The analog multiplexor input select control 26 receives control signals, Fault Lo Freq and Fault hi Freq, and provides select control signals, S1 and S2, to the analog multiplexor 516. Which one of the signals at the ports A, B or C is selected depends on what the signals S1 and S2 are.

Figures 13, 14:
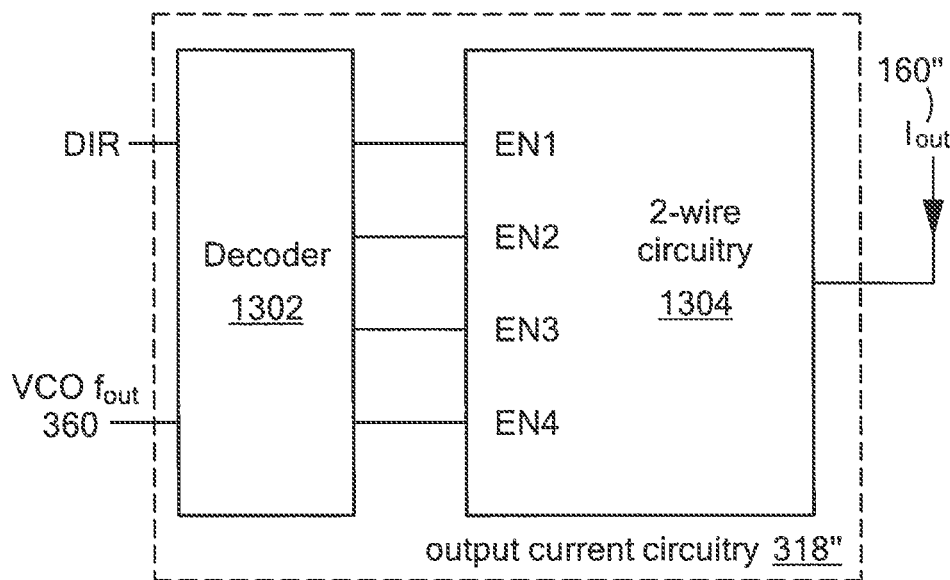
FIG. 13 is a diagram of another example of output current circuitry.
FIG. 14 is a table of example responses to select control signals for an analog multiplexor.

Referring to FIG. 13, an example of the output current circuitry 318 is an output current circuitry 318'. In one example, the output current circuitry 318' includes a decoder 1302 and a two-wire circuitry 1304. In one example, the decoder 1302 is the same as the decoder 602' (FIG. 7) and the two-wire circuitry 1304 is the same as the two-wire circuitry 604' (FIG. 8) except the output signal is Iout 160".

Referring to FIG. 14, a table 1400 illustrates one example of how the analog multiplexor 516 functions. If there is no fault (i.e., the frequency of output signal, Iout 160" is between Fmin and Fmax), then the select control signals S1 and S2 are each '0' and the signal, filter out 528 is selected from port A and provided to the VCO 518. If there is a fault in the low frequency (i.e., the frequency of output signal Iout 160" is below Fmin), then the select control signals S1 and S2 are '0' and '1' respectively and the signal, Vflow is selected from port B and provided to the VCO 518. If there is a fault in the high frequency (i.e., the frequency of output signal Iout 160" is above Fmax), then the select control signals S1 and S2 are '1' and '0' respectively and the signal, Vfhi is selected from port C and provided to the VCO 518.

Figure 15A:
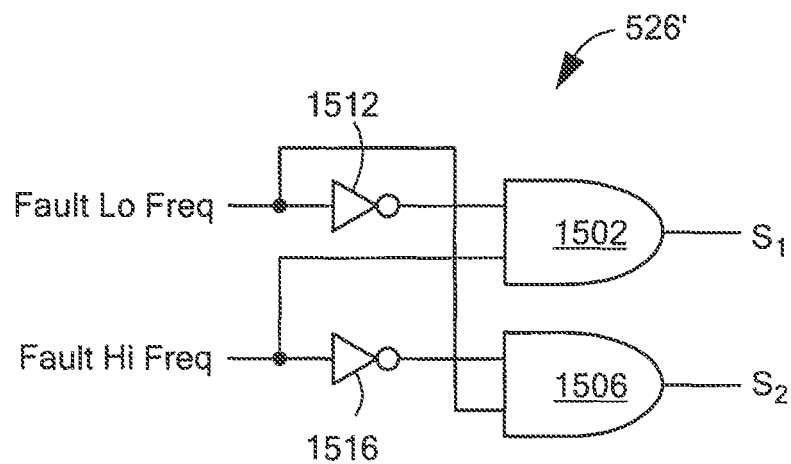
FIG. 15A is a logic diagram of an example of an analog multiplexor input select control receiving two control signals.

Referring to FIG. 15A, one example of the analog multiplexor input select control 526 is an analog multiplexor input select control 526'. The analog multiplexor input select control 526' includes AND gates 1502 and 1506. The AND gate 1502 receives the control signal, Fault hi Freq. The control signal, Fault Lo Freq, is inverted by the inverter 1512 and provided as an input to the AND 1502. The AND gate 1502 provides an output signal, which is the select control signal, S1.

The AND gate 1506 receives the control signal, Fault Lo Freq. The signal, Fault hi Freq, is inverted by the inverter 1516 and provided as an input to the AND 1506. The AND gate 1506 provides an output signal, which is the select control signal, S2.

Figure 15B:
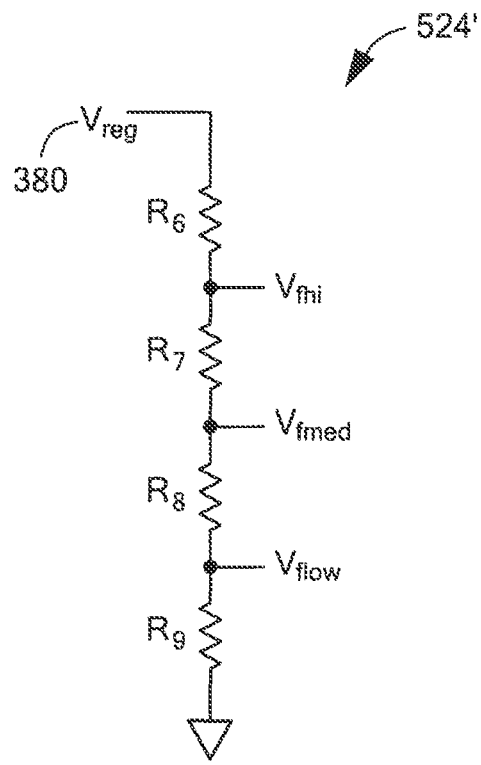
FIG. 15B is a circuit diagram of an example of a fault voltage block.

Referring to FIG. 15B, one example of the fault voltage block 524 is a fault voltage block 524'. In one example, the fault voltage block 524' is a voltage divider that includes resistors, $R_6$, $R_7$, $R_8$, $R_9$ connected in series with the voltage, Vreg, and ground. The signal, Vfhi is provided between the resistors $R_6$, $R_7$; the signal, Vfmed is provided between the resistors $R_7$, $R_8$; and the signal, Vflow is provided between the resistors $R_8$, $R_9$.

Figures 15C, 15D:
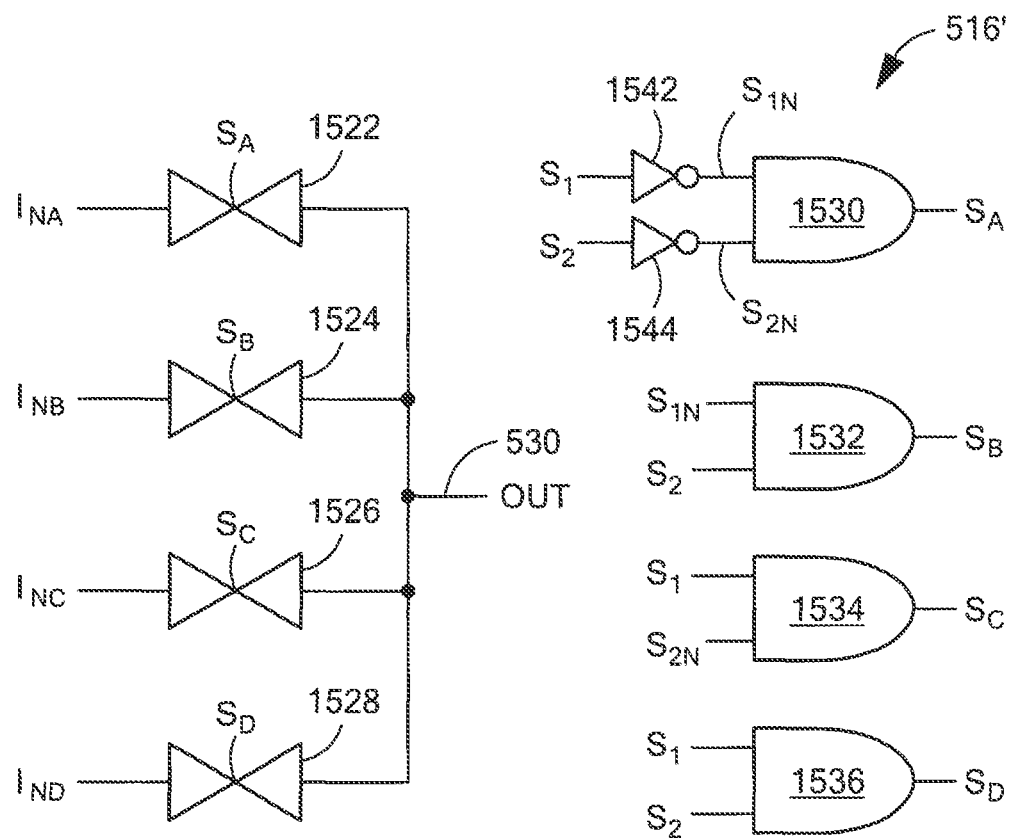
FIG. 15C is a logic diagram of an example of an analog multiplexor.
FIG. 15D is a table of example select control signals to an analog multiplexor.

Referring to FIG. 15C, one example of the analog multiplexor 516 is an analog multiplexor 516'. The analog multiplexor input 516' includes switches 1522, 1524, 1526, 1528 and AND gates 1530, 1532, 1534, 1536. The AND gate 1530 receives a signal S1N and a signal S2N to produce a signal SA. The signal S1N is provided by inverting the signal S1 using an inverter 1542 and the signal S2N is provided by inverting the select control signal S2 using an inverter 1544.

The AND gate 1532 receives the signal S1N and the select control signal S2 to produce a signal SB. The AND gate 1534 receives the select control signal S1 and the signal S2N to produce a signal SA. The AND gate 1536 receives the signal S1 and the select control signal S2 to produce a signal SD.

The signals SA, SB, SC, SC and SD are used to activate the switches 1522, 1524, 1526, 1528 respectively. If the switch 1522 is activated, a signal InA is provided as the output signal 530; if the switch 1524 is activated, a signal InB is provided as the output signal 530; if the switch 1526 is activated, a signal InC is provided as the output signal 530; if the switch 1528 is activated, a signal InD is provided as the output signal 530 as depicted in a table 1550 in FIG. 15D. In one particular example, the signal InA represents the signal filter out 528, the signal InB represents the signal Vflow and the signal InC represents the signal Vfhi.

Figure 16:
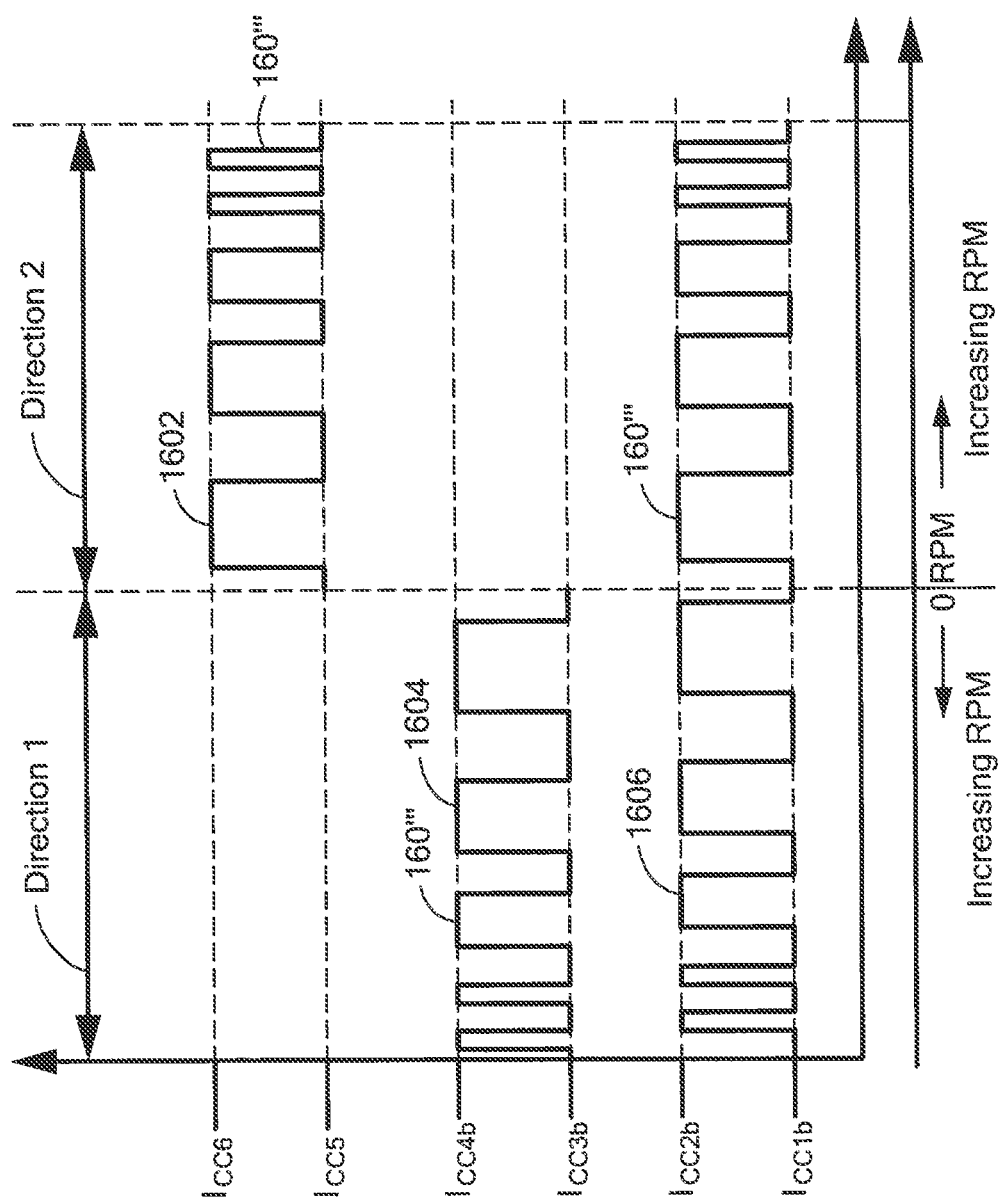
FIG. 16 is a graph of further example of an output signal to the IC of FIG. 1.
Figure 17:
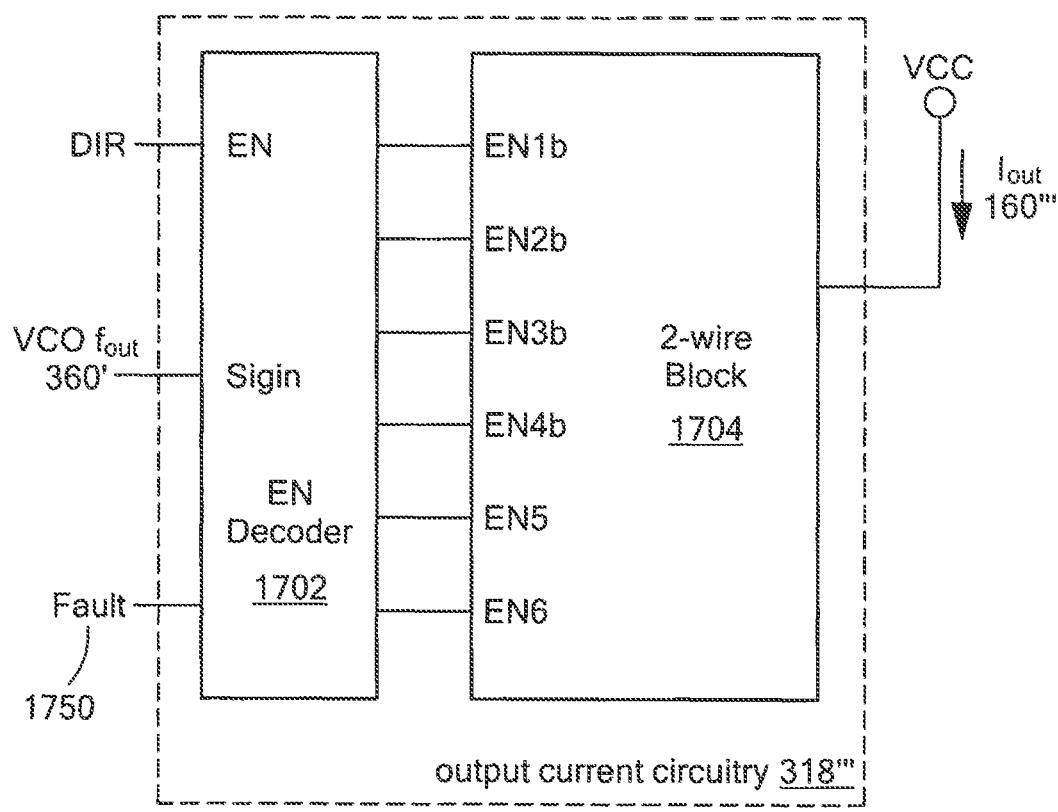
FIG. 17 is block diagram of a further example of an output current circuitry.

Referring to FIGS. 16 and 17, in another embodiment, speed and direction as well as faults may be determined from an output signal, Iout 160'''. In this embodiment, the output signal Iout 160''' may be one of six current levels: $I_{CC1b}$, $I_{CC2b}$, $I_{CC3b}$, $I_{CC4b}$, $I_{CC5}$ and $I_{CC6}$. For example, the waveform 1602 depicts the output signal Iout 160''' alternating between $I_{CC5}$ and $I_{CC6}$. In this example, the rotating magnet structure 140 (FIG. 1) is rotating in a direction 2. The frequency of the alternating between $I_{CC5}$ and $I_{CC6}$ indicates the speed. There are no faults detected.

In another example, the waveform 1604 depicts the output signal, Iout 160''' alternating between $I_{CC3b}$ and $I_{CC4b}$. In this example, the rotating magnet structure 140 (FIG. 1) is rotating in a direction 1 opposite direction 2. The frequency of the alternating between $I_{CC3b}$ and $I_{CC4b}$ indicates the speed of the rotating magnet structure 140. There are no faults detected.

In a further example, the waveform 1606 depicts the output signal, Iout 160''' alternating between $I_{CC1b}$ and $I_{CC2b}$ when at least a fault condition exists. In this example, the rotating magnet structure 140 (FIG. 1) may be rotating in a direction 1 or a direction 2. The frequency of the alternating between $I_{CC1b}$ and $I_{CC2b}$ indicates the speed.

In one example, output current circuitry in this embodiment is output current circuitry 318''', which includes a decoder 1702 and a two-wire block 1704. The decoder 1702 receives the signal, DIR, the VCO fout signal 360 and a fault signal 1750. In one example, the decoder 1702 provides one of six signals (signal EN1b, signal EN2b, signal EN3b, signal EN4b, signal EN5 and signal EN6) to the two-wire circuitry 1704. In one particular example, when the signal EN1b is provided, the output signal Iout 160''' is equal to the current level $I_{CC1b}$; when the signal EN2b is provided, the output signal Iout 160''' is equal to the current level $I_{CC2b}$; when the signal EN3b is provided, the output signal Iout 160''' is equal to the current level $I_{CC3b}$; when the signal EN4b is provided, the output signal Iout 160''' is equal to the current level $I_{CC4b}$; when the signal EN5 is provided, the output signal Iout 160''' is equal to the current level $I_{CC5}$; and when the signal EN6 is provided, the output signal Iout 160''' is equal to the current level $I_{CC6}$.

Figure 18:
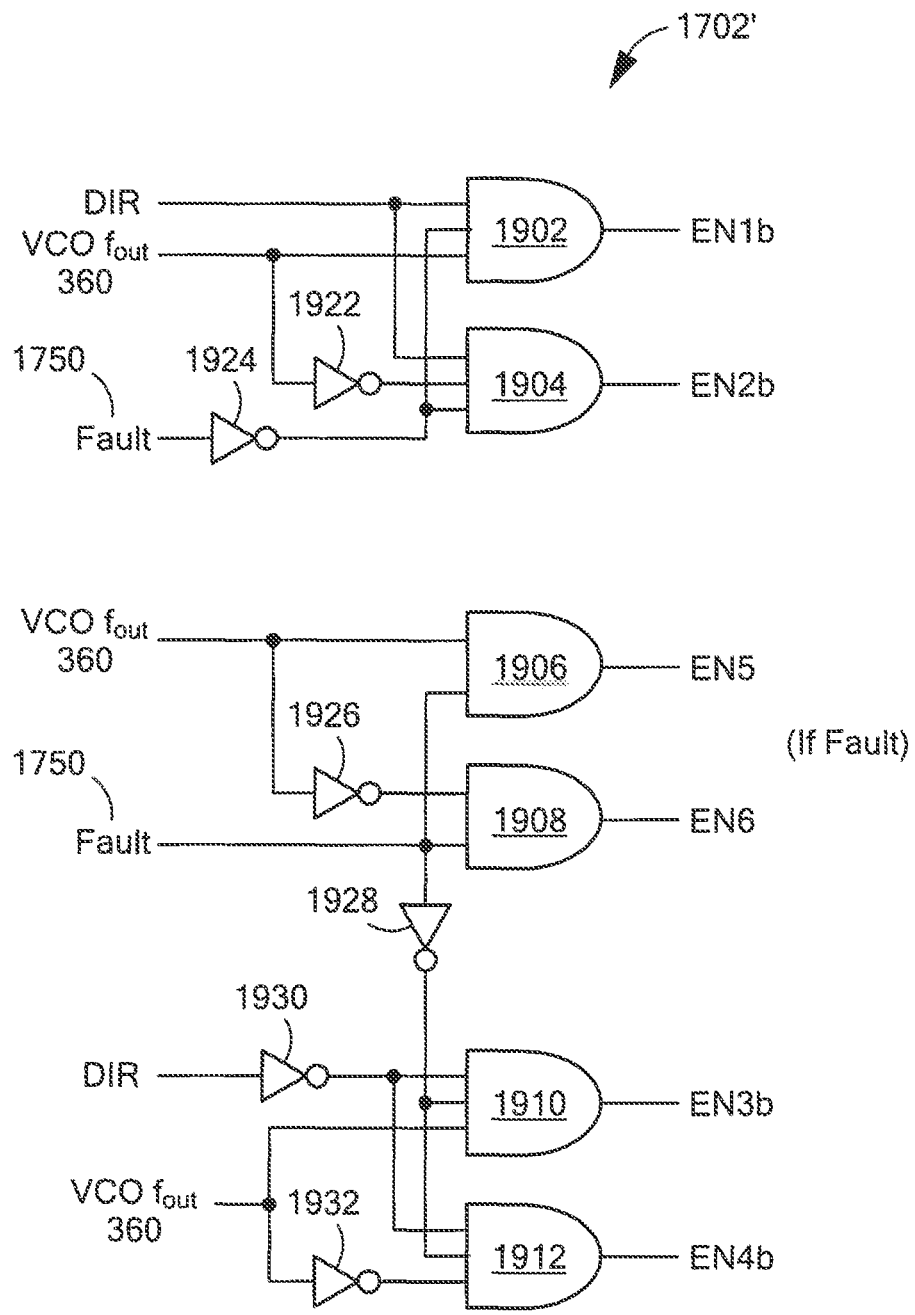
FIG. 18 is a logic diagram of an example of a decoder.

Referring to FIG. 18, one example of the decoder 1702 is a decoder 1702'. The decoder 1702' includes an AND gate 1902, an AND gate 1904, an AND gate 1906, an AND gate 1908, an AND gate 1910, and an AND gate 1912. The AND gate 1902 receives the direction signal 344, the VCO fout signal 360 and an inverted signal of the fault signal 1750, which is inverted by the inverter 1924, to form the signal EN1b. The AND gate 1904 receives the direction signal 344, an inverted signal of the VCO fout signal 360, which is inverted by an inverter 1922 and the inverted signal of the fault signal 1750, which is inverted by the inverter 1924 to form the signal EN2b.

The AND gate 1906 receives the VCO fout signal 360 and the fault signal 1750 to form the signal EN5. The AND gate 1908 receives an inverted signal of the VCO fout signal 360, which is inverted by an inverter 1926 and the fault signal 1750 to form the signal EN6.

The AND gate 1910 receives an inverted signal of the signal DIR, which is inverted by an inverter 1930; the VCO fout signal 360 and an inverted signal of the fault signal 1750, which is inverted by the inverter 1928, to form the signal EN3b. The AND gate 1912 receives the inverted signal of the signal DIR, which is inverted by the inverter 1930; an inverted signal of the VCO fout signal 360, which is inverted by an inverter 1932 and the inverted signal of the fault signal 1750, which is inverted by the inverter 1928, to form the signal EN4b.

Figure 19:
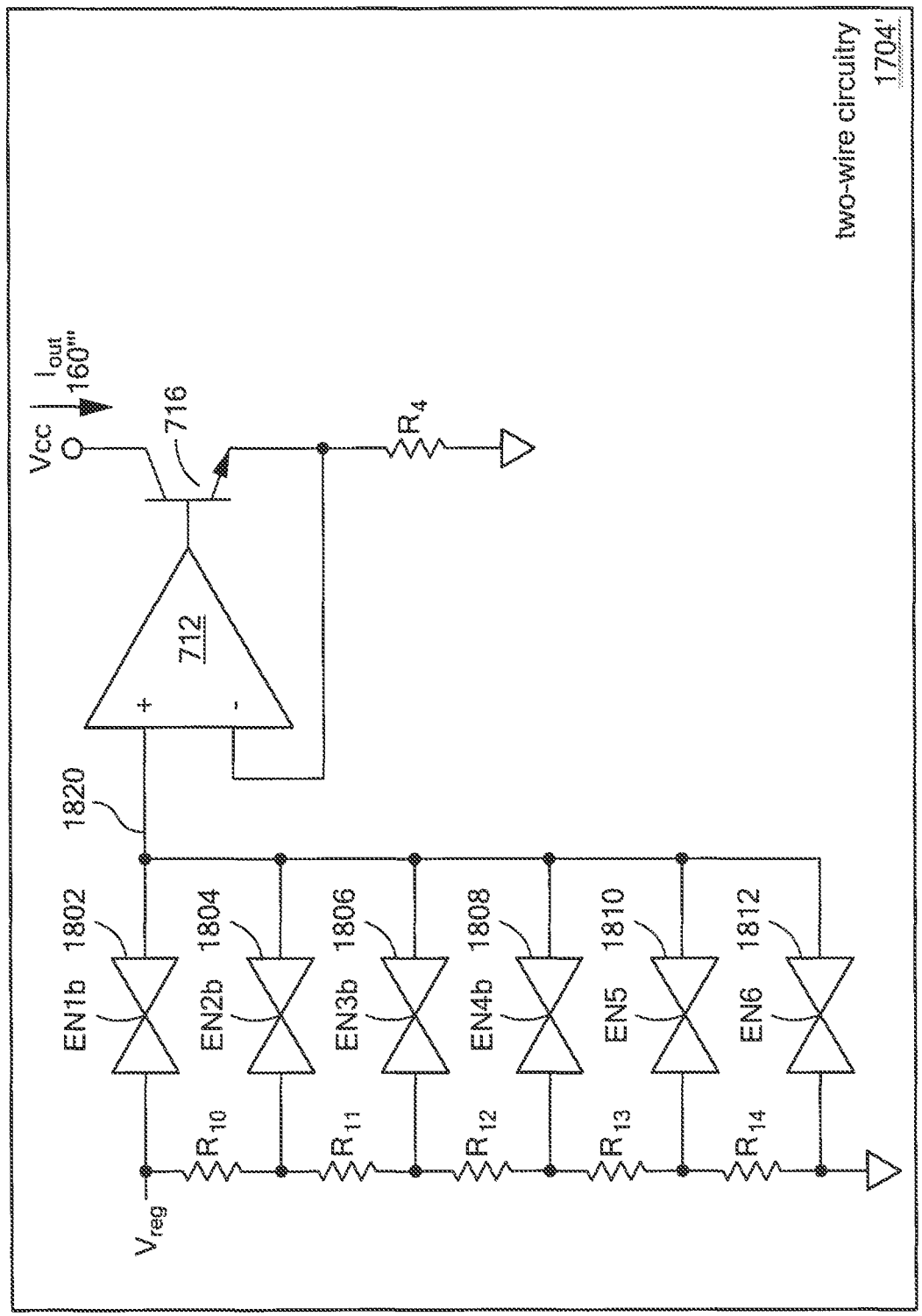
FIG. 19 is a circuit diagram of a further example of two-wire circuitry.

Referring to FIG. 19, an example of a two-wire circuitry 1704 is the two-wire circuitry 1704'. The two-wire circuitry 1704' includes switches 1802, 1804, 8106, 1808, 1810, 1812 that form a voltage divider with resistors $R_{10}$, $R_{11}$, $R_{12}$, $R_{13}$, $R_{14}$, which provides a signal 1820 to a first terminal of an operational amplifier 712, which provides an output signal to a base of a transistor 716.

In one example, the switch 1802 is closed when enabled by the signal EN1b, the switch 1804 is closed when enabled by the signal EN2b, the switch 1806 is closed when enabled by the signal EN3b, the switch 1808 is closed when enabled by the signal EN4b, the switch 1810 is closed when enabled by the signal EN5, the switch 1812 is closed when enabled by the signal EN6. In one example, only one of the signals EN1b, EN2b, EN3b, EN4b, EN5, EN6 is enabled at a time.

Figure 20:
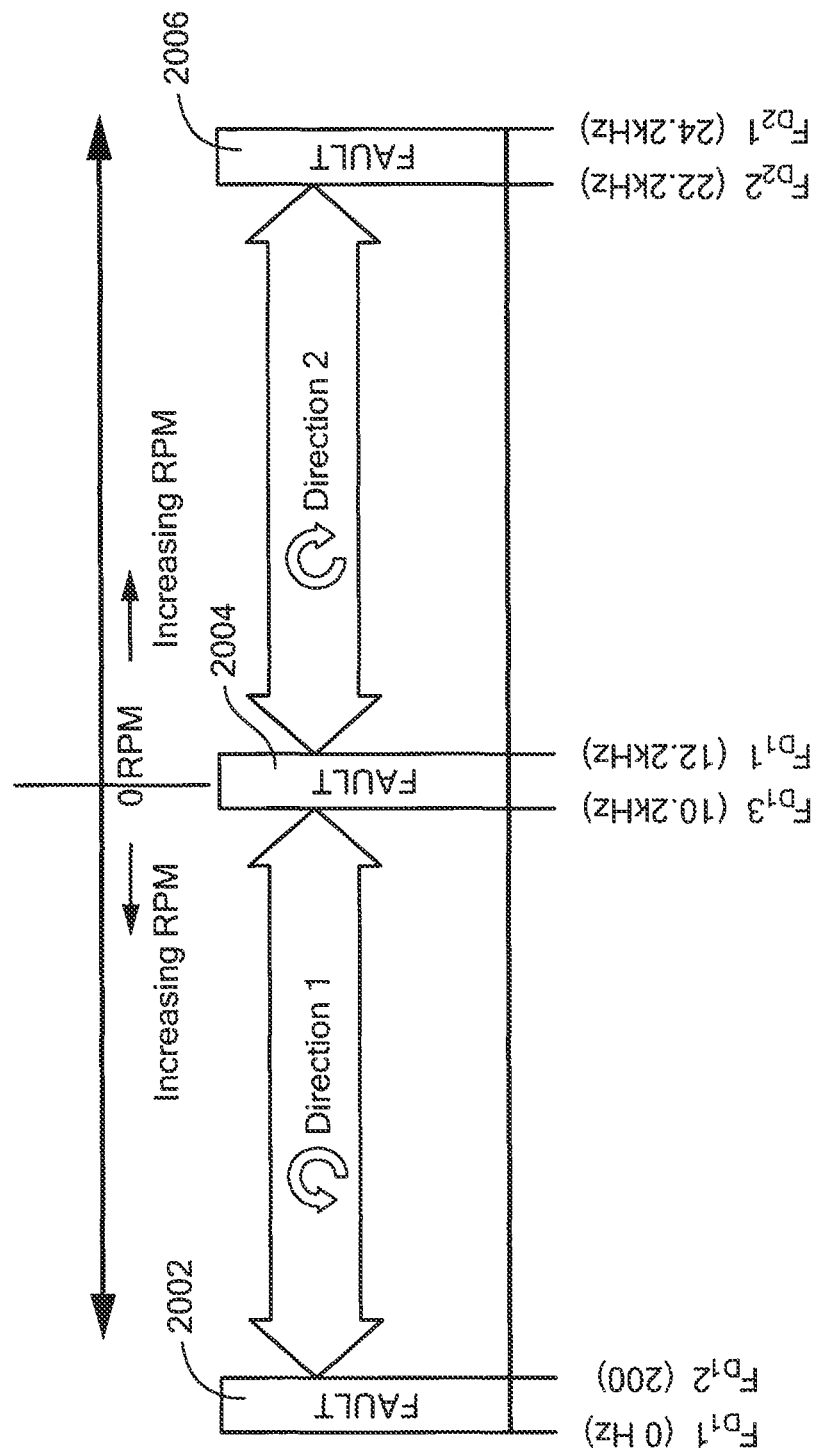
FIG. 20 is a graph of an example of frequency of an output signal of a magnetic field sensor of FIG. 21.

Referring to FIG. 20, in a still further embodiment, the frequency of the output signal. Iout 160 (FIG. 1) may also be used to identify one or more faults. In one particular example, frequency between 0 and 200 Hz indicates a first fault 2002, a frequency between 10.2 kHz and 12.2 kHz indicates a second fault 2004 and a frequency between 22.2 kHz indicates a third fault 2006.

The frequency between 201 Hz and 10.19 kHz indicates that the rotating magnet is rotating in a first direction. The speed of the rotating magnet in the first direction is slower for frequencies near 10.19 kHz than for frequencies near 200 Hz.

The frequency 12.3 kHz to 22.1 kHz indicates that the rotating magnet is rotating in a second direction opposite the first direction. The speed of rotating magnet is slower for frequencies near 12.3 kHz than for frequencies near 22.1 kHz.

Figure 21:
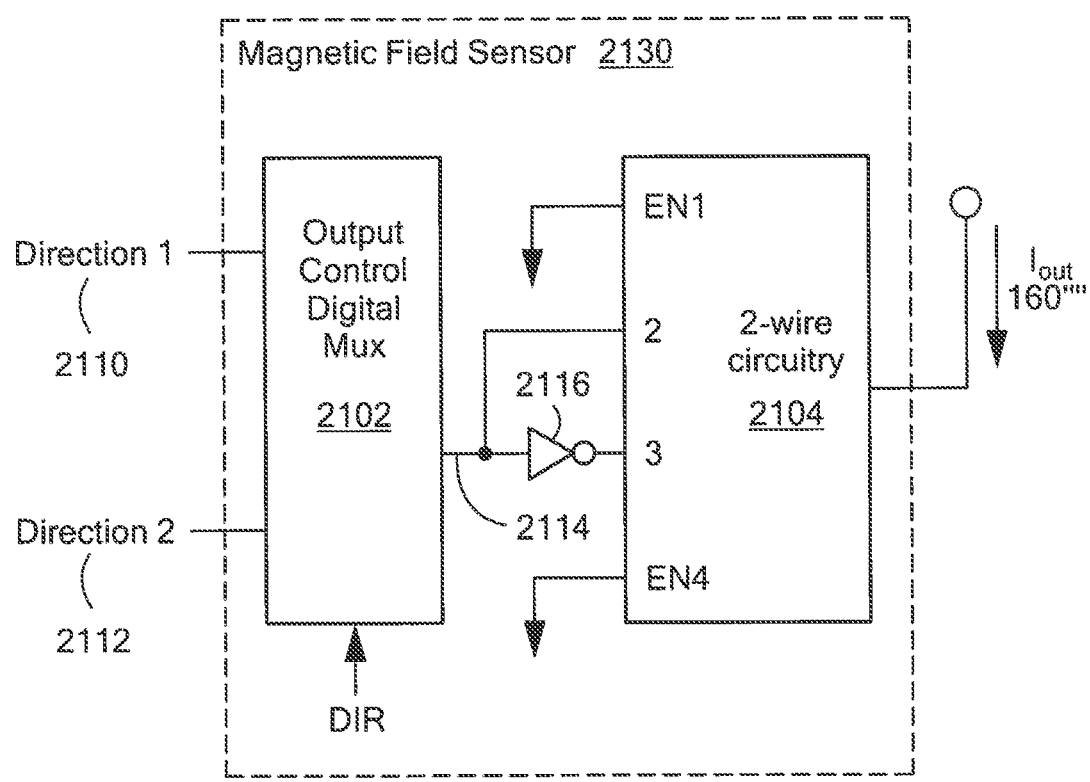
FIGS. 21 to 24 are block diagrams of a still further example of the magnetic field sensor.

Referring to FIG. 21, a further example of a magnetic field sensor 130 (FIG. 1) is a magnetic field sensor 2130, which provides one or more faults, for example, as depicted in FIG. 20 by taking the frequency of the output signal, Iout 160''''. In one example, the magnetic field sensor 130'''' includes an output control digital multiplexor 2102 and a two-wire block 2104. The output control digital multiplexor 2102 signal receives a signal, Direction 1 2110 and a signal, Direction 2 2112 and selects which of the signals to output based on the signal, DIR as a signal 2114. The signal 2114 is sent to one of the ports of the two-wire block 2104 (e.g., port 2) and the signal 2114 is inverted by the inverter 2114 and sent to another port of the two-wire block 2104 (e.g., port 3).

Figure 22:
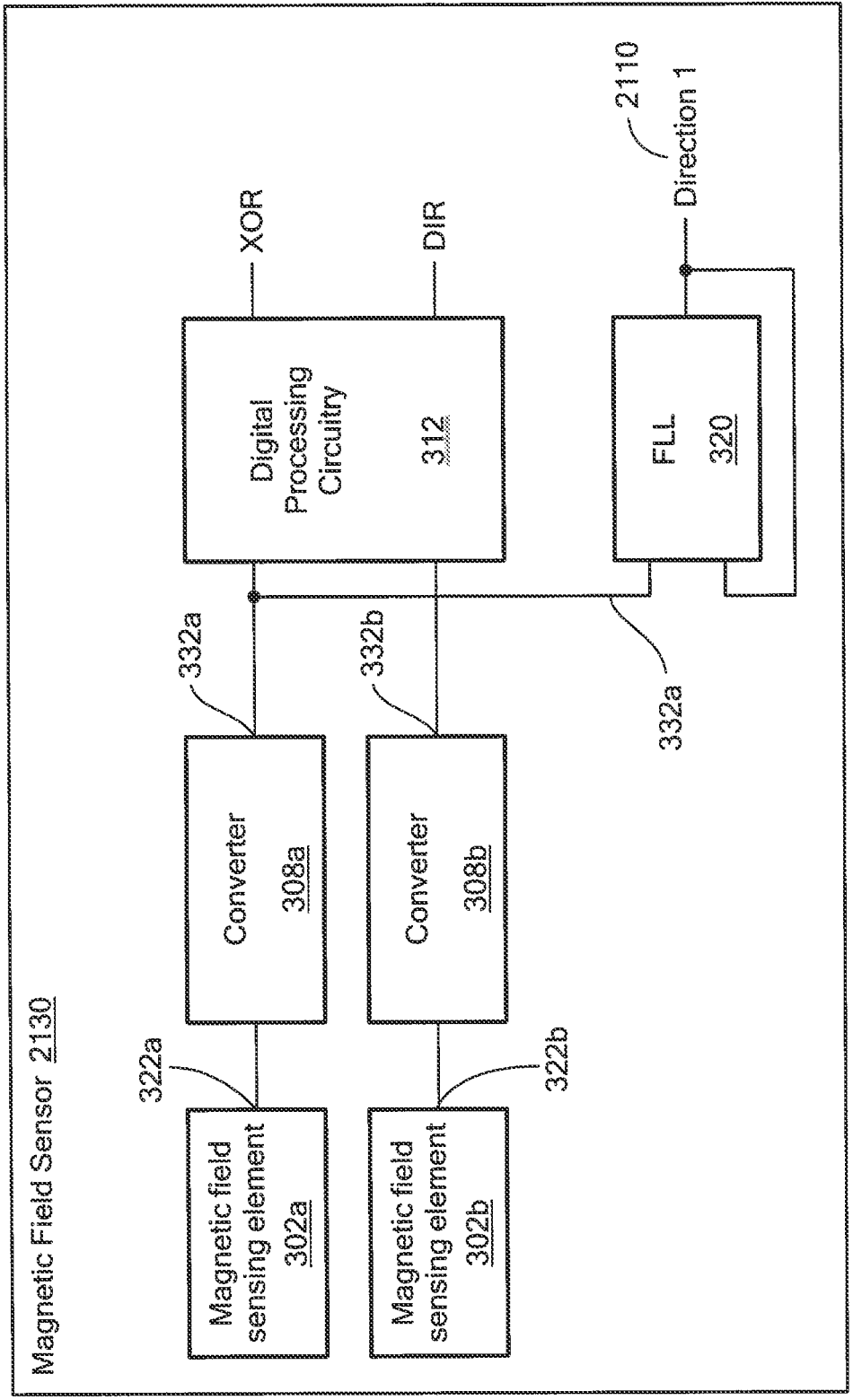

Referring to FIG. 22, in order to produce the signal Direction 1 2110, the magnetic field sensor 2130 further includes similar components to the magnetic field sensor 130' such as the magnetic field sensing elements 302a, 302b, the converters 308a, 308b, the digital processing circuitry 312 and the FLL 320. The output of the FLL 320 produces the signal, Direction 1 2110.

Figure 23:
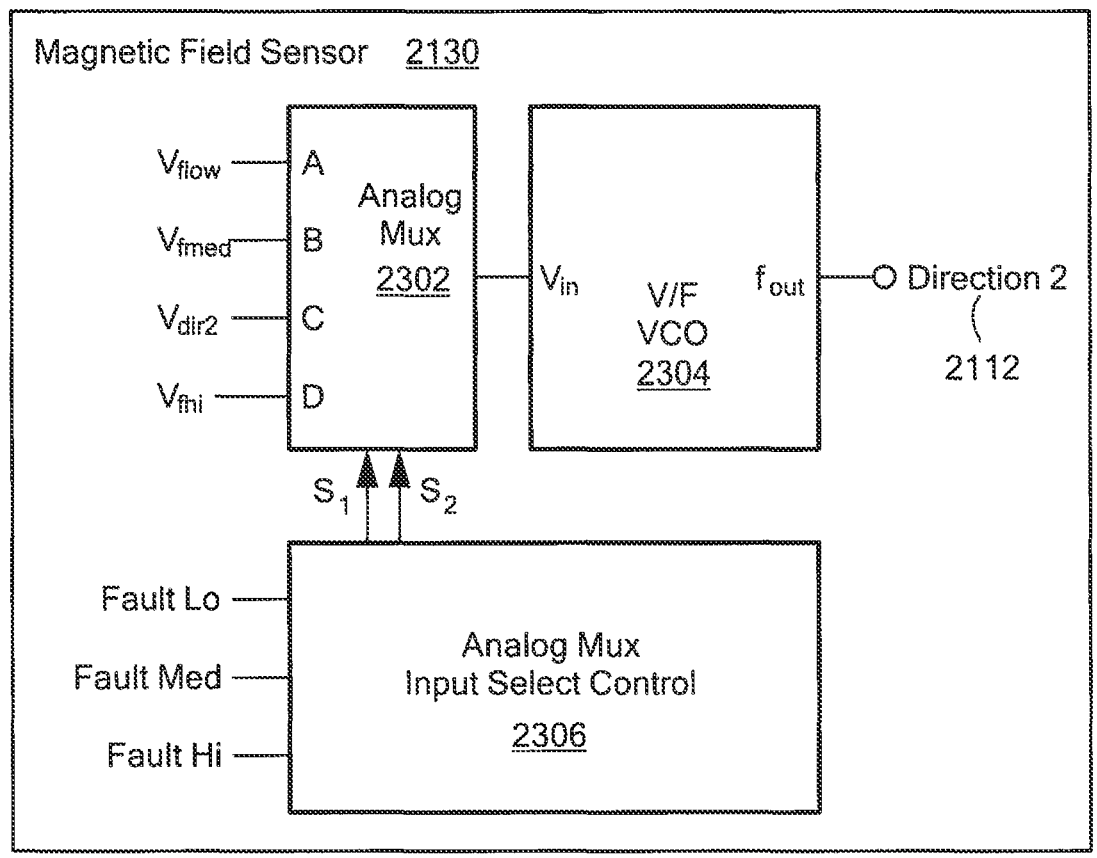

Referring to FIG. 23, in order to produce the signal Direction 2 2112, the magnetic field sensor 2130 further includes an analog multiplexor 2302, a VCO 2304 and an analog multiplexor input select control 2306. In one example, the analog multiplexor 2302 is the same as the analog multiplexor 516 (FIG. 12A). In another example, the analog multiplexor 2302 is the same as the analog multiplexor 516' (FIG. 15C). The analog multiplexor 2302 receives the signal Vflow at a port A, the signal VFmed at a port B a signal Vdir2 at a port C and the signal Vfhi at a port D. The analog multiplexor input select control 2306 receives three control signal, Fault Lo, Fault Med and Fault Hi to determine the select control signals S1 and S2.

The analog multiplexor 2302 receives select control signals, S1 and S2, from the analog multiplexor input select control 2306 then selects which signal received at the ports A, B, C or D is sent to the VCO 2304.

In one example, the signals Vflow, Vfmed and Vfhi are generated using the fault voltage block 524'. In one example, the signal Vflow corresponds to the first fault 2002, the signal Vfmed corresponds to the second fault 2004 and Vfhi corresponds to the fault 2006.

Figure 24:
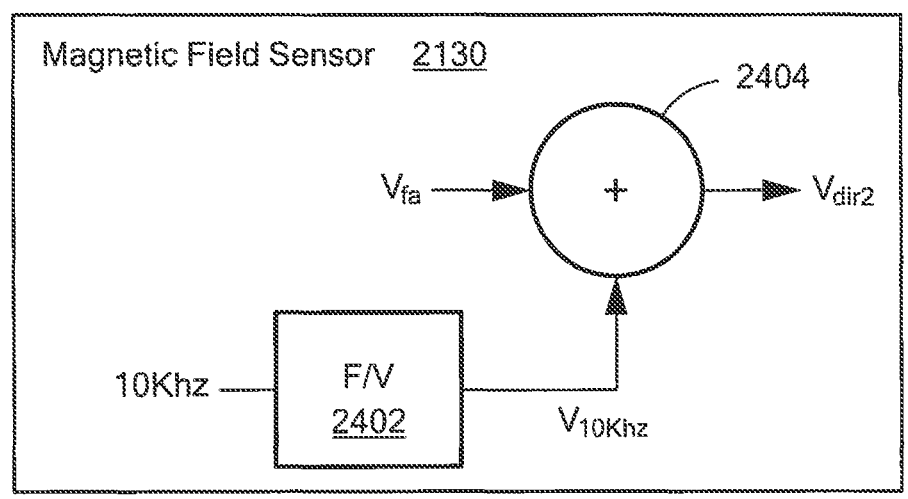

Referring to FIG. 24, in order to form the signal Vdir2, the magnetic field sensor 130'''' further includes a frequency/voltage converter 2402 and an adder 2404. The signal Vfa (FIG. 5) is increased by a voltage corresponding to 10 kHz, for example, by the adder 2404 to form the signal Vdir2.

Figure 25:
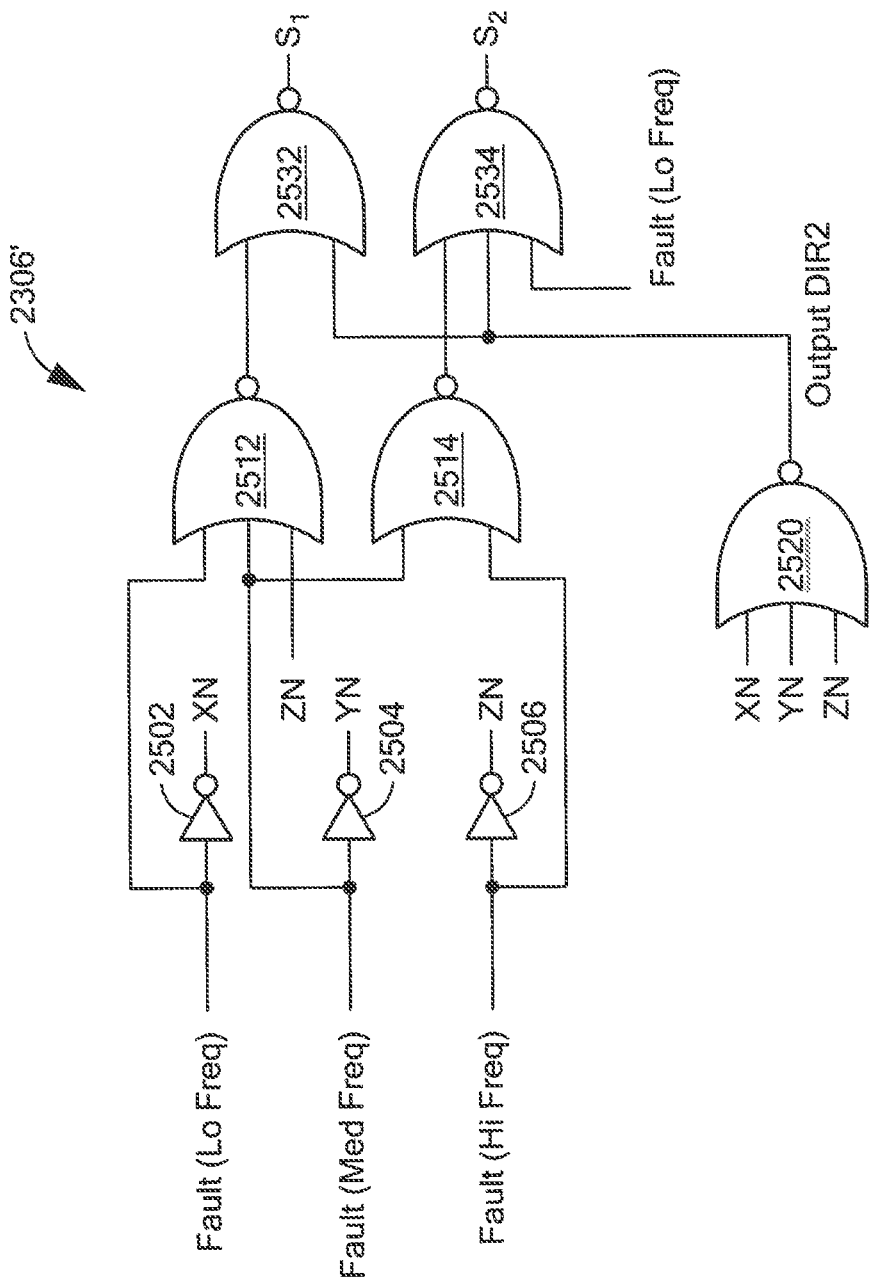
FIG. 25 is a logic diagram of an example of an analog multiplexor input select control receiving three control signals.

Referring to FIG. 25, an example of the analog multiplexor input select control 2306 is an analog multiplexor input select control 2306'. The analog multiplexor input select control 2306' includes inverters 2502, 2504, 2506; an OR gates 2532; NOR gates 22512, 514, 2534 and an AND gate 2520.

The inverter 2502 inverts the control signal Fault (Lo freq) signal to form a signal XN. The inverter 2504 inverts the control signal Fault (Med freq) signal to form a signal YN. The inverter 2506 inverts the control signal Fault (hi freq) signal to form a signal ZN.

The NOR gate 2512 receives the control signal Fault (Lo freq) signal, the control signal Fault (Med freq) signal and the signal ZN. The NOR gate 2514 receives the control signal Fault (Med freq) signal and the control signal Fault (hi freq) signal. The AND gate receives signals, XN, YN and ZN.

The OR gate 2532 receives the outputs from the NOR gate 2512 and the AND gate 2520 to produce the select control signal S1. The NOR gate 2534 receives the outputs from the NOR gate 2514 and the AND gate 2520, and the control signal Fault (Lo freq) to produce the select control signal S2.

Figures 26, 27:
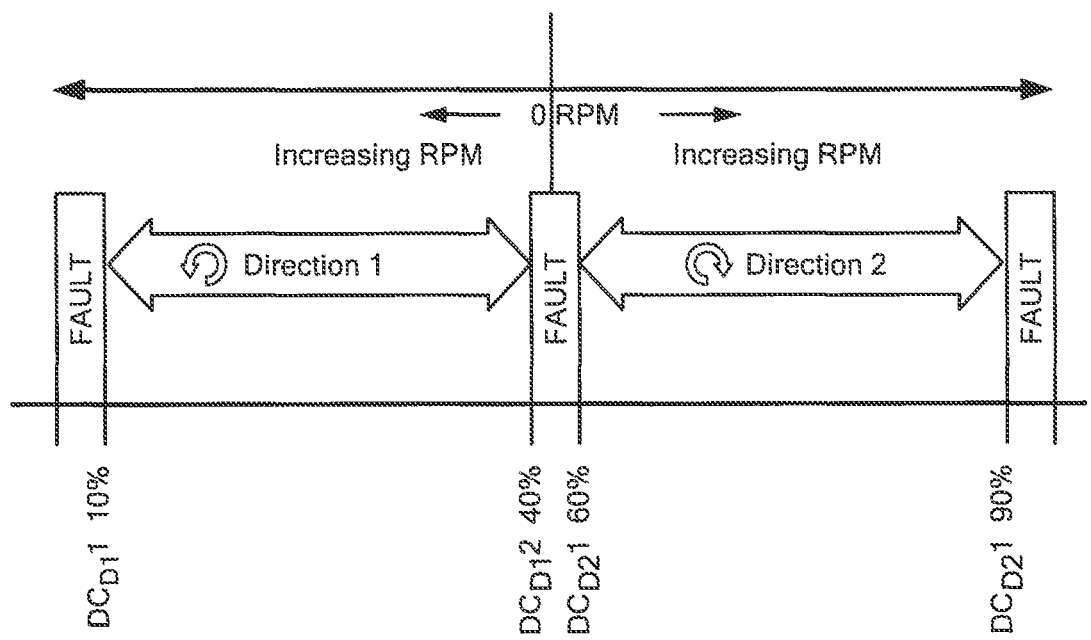
FIG. 26 is a table of example responses to select control signals for an analog multiplexor.
FIG. 27 is a graph of an example of duty cycle of a pulse width modulation (PWM) output of a magnetic field sensor of FIG. 28.

Referring to FIG. 26, a table 2600 illustrates one example of how the analog multiplexor 2302 functions. If there is a low frequency fault (e.g., a fault 2002 (FIG. 20), then the select control signals S1 and S2 are each '0' and the signal, Vflow is selected from port A and provided to the VCO 2304. If there is a medium frequency fault (e.g., a fault 2004 (FIG. 20), then the select control signals S1 and S2 are '0' and '1' respectively and the signal, Vfmed is selected from port B and provided to the VCO 2304. If there is no fault, then the select control signals S1 and S2 are '1' and '0' respectively and the signal, Vfdir is selected from port C and provided to the VCO 2304. If there is a high frequency fault (e.g., fault 2006 (FIG. 20), then the select control signals S1 and S2 are each '1' and the signal, Vfhi is selected from port D and provided to the VCO 2304.

Figure 28:
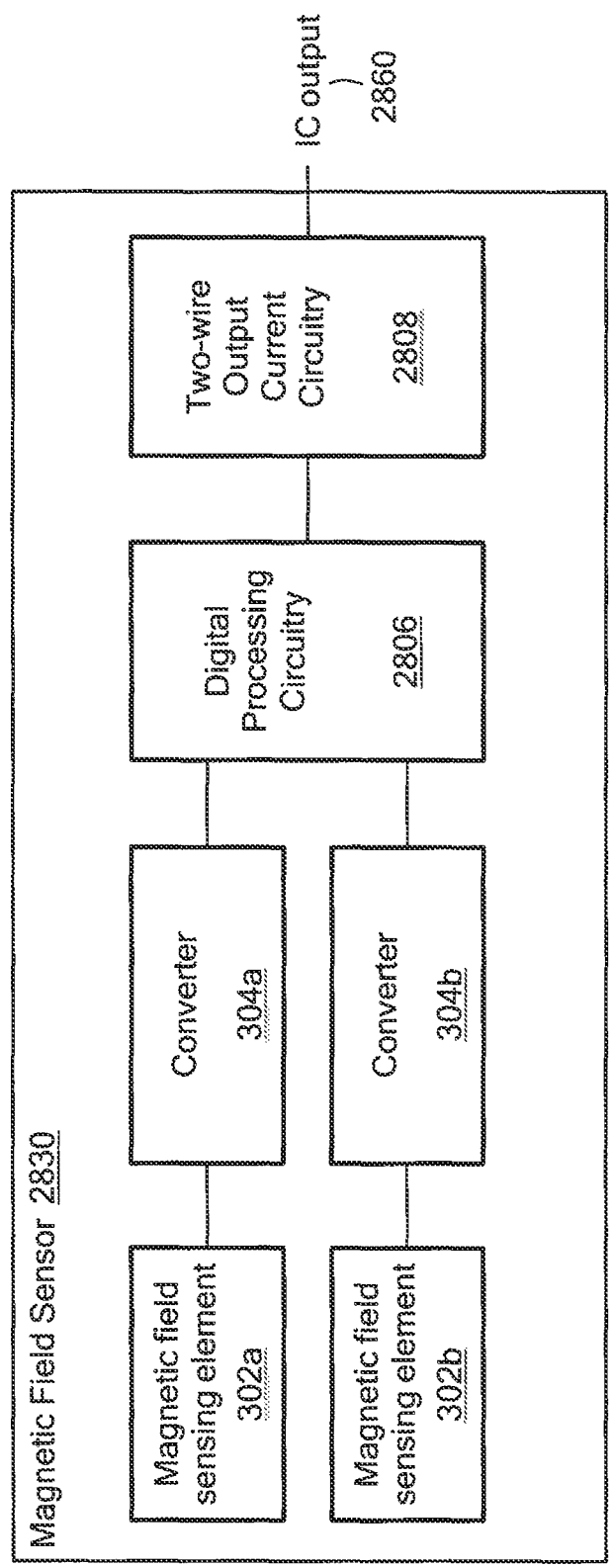
FIG. 28 is a block diagram of another example of a magnetic sensor.

Referring to FIGS. 27 and 28, in a still further embodiment, a duty cycle of a pulse width modulation (PWM) output may be used to determine if a fault exists. In one particular example, a duty cycle between 1% to 10%, 40% to 60% and 90% to 99% may indicate that a fault exists. A duty cycle between 11% and 39% may indicate that the rotating magnetic structure 140 (FIG. 1) is rotating in a direction 1 and a duty cycle between 61% and 89% may indicate that the rotating magnetic structure 140 is rotating a direction 2 opposite the direction 1.

An example of the magnetic field sensor 130 in this embodiment is a magnetic field sensor 2830. Similar to the magnetic field sensor 130', the magnetic field sensor 2830 includes the magnetic field sensing element 302a and the converter 308a that form the Channel A and includes the magnetic field sensing element 302b and the converter 304b that form the Channel B. The magnetic field sensor 2830 also includes a digital processing block 2806 that receives input from the Channels A and B and provides an output to a two-wire output current circuit 2808, which provides an IC output signal 2860 in the form of a PWM output.

Referring to FIG. 29, an example of a process to generate a PWM output is a process 2900. Process 2900 waits until a rising edge of channel A (2902) and counts clock edges until the next rising edge in Channel A (2908).

Process 2900 determines pulse width percentage based on clock edges determined (2912). For example, the total number of clock edges determined in processing block 2908 is converted to speed and the speed is used to determine a pulse width percentage. For example, speed in revolutions per minute (RPM) is equal to 60 seconds divided by the product of the number of clock edges times 1 microsecond. In one example, a lookup table or an equation may be used to determine the pulse width percentage using the speed. In one particular example, the carrier frequency is 1 kHz.

One example of a look-up table is:

| Magnet target Frequency | Direction | Duty cycle | 1 uSec Clock edges | Pulse width for 1 kHz carrier |
|---|---|---|---|---|
| 1 rpm | Direction 1 | 10% | 10,000,000 | 100 microSec |
| 10K rpm | " | 40% | 6000 | 400 microSec |
| 1 rpm | Direction 2 | 60% | 10,000,000 | 600 microSec |
| 10K rpm | " | 90% | 6000 | 900 microSec |

In a further example, an equation may be derived to represent the target speed and convert it to pulse width modulated duty cycle. In one particular example, using the assumptions that 1 RPM is 10% pulse width, and 10,000 RPM is 40% pulse width, the following equation may be used for direction 1:

Direction 1 Pulse Width (in %)=(10+[Log$_{10}$(speed)* 7.5])=(10+[Log$_{10}$(6$E$+07/Clks)*7.5]), where Clks equals to the number of clock edges determined in processing block 2912.
For instance if speed is 1, then [Log$_{10}$(1) is 0, so Pulse Width is 10%. If speed is 10000, then Log$_{10}$(10000) is 4, so Pulse Width=(10+[4*7.5])=40.

For direction 2 with 60 to 90% pulse width, the equation would be:

Direction 2 Pulse Width (in %)=(60+[Log$_{10}$(speed)* 7.5])=(60+[Log$_{10}$(6$E$+07/Clks)*7.5]).

In other examples, a different equation may be derived for 0.1 or 0 RPM, or the definition of the pulse width for minimum speed (say 10.1%) and maximum speed pulse width of 39.9% may be changed.

Process 2900 updates the previous pulse width percentage with the new pulse width percentage (2918) and stores the pulse width percentage (2922). In one example, the pulse width percentage is a pulse width percentage 3020 stored in a non-volatile memory 3006 (FIG. 30). After processing block 2918, process 2900 also repeats processing blocks 2902, 2908, 2912, 2918.

Process 2900 generates an output for a period of time using the pulse width percentage stored (2926). For example, assuming a 1 kHz carrier, a 1,000 microsec output is started remaining high based on the store pulse width percentage and low for the remainder of the 1,000 microseconds.

Process 2900 repeats processing block 2926. For example, after the 1,000 microseconds in the previous example, process 2900 repeats processing block 2926 for the next 1,000 microseconds.

Referring to FIG. 30, an example of the digital processing circuitry 2806 is digital processing circuitry 2806'. The digital processing circuitry 2806' includes a processor 3002, a volatile memory 3004 and a non-volatile memory 3006. Non-volatile memory 3006 includes an operating system 3016; data 3018, which includes the pulse width percentage 3020; and instructions 3012, which are executed out of volatile memory 3004 to perform all or part of process 2900.

The processes described herein (e.g., process 2900) are not limited to use with the hardware of FIG. 30; they may find applicability in any computing or processing environment and with any type of machine or set of machines that is capable of running a computer program. The processes described herein may be implemented in hardware, software, or a combination of the two. The processes described herein may be implemented in computer programs executed on programmable computers/machines that each includes a processor, a non-transitory machine-readable medium or other article of manufacture that is readable by the processor (including volatile and non-volatile memory and/or storage elements), at least one input device, and one or more output devices. Program code may be applied to data entered using an input device to perform any of the processes described herein and to generate output information.

The processing blocks (for example, in the process 2900) associated with implementing the system may be performed by one or more programmable processors executing one or more computer programs to perform the functions of the system. All or part of the system may be implemented as, special purpose logic circuitry (e.g., an FPGA (field-programmable gate array) and/or an ASIC (application-specific integrated circuit)). All or part of the system may be implemented using electronic hardware circuitry that include electronic devices such as, for example, at least one of a processor, a memory, a programmable logic device or a logic gate.

The processes described herein are not limited to the specific examples described. For example, the process 2900 is not limited to the specific processing order of FIG. 29. Rather, any of the processing blocks of FIG. 29 may be re-ordered, combined or removed, performed in parallel or in serial, as necessary, to achieve the results set forth above.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An integrated circuit (IC) comprising:
a magnetic field sensor to detect speed and direction of angular rotation of a rotating magnetic structure, the magnetic field sensor comprising:
at least two magnetic field sensing elements configured to sense changes in a magnetic field caused by rotation of the magnetic structure;
an output port configured to provide an output signal of the magnetic field sensor, the frequency of the output signal indicating the speed,
wherein a frequency of the output signal being between a first frequency and a second frequency indicates the magnetic structure rotating in a first direction,
wherein the frequency of the output signal being between a third frequency and a fourth frequency indicates the magnetic structure rotating in a second direction opposite the first direction,
wherein the frequency of the output signal indicates one or more faults in response to the frequency being at least one of:
less than the first frequency,
greater than the fourth frequency, or
between the third frequency and the second frequency,
wherein the first frequency is less than the second frequency, the second frequency is less than the third frequency and the third frequency is less than the fourth frequency.

2. The IC of claim 1, wherein the magnetic structure is a ring magnet.

3. The IC of claim 1, wherein the fault indicating at least one of: a loose wire, malfunction of the IC, a gap between the magnetic structure and the IC being above or below a distance threshold or a temperature of the IC exceeds a temperature threshold.

4. The IC of claim 1, wherein at least one of the at least two magnetic field sensing elements comprises at least one of a Hall effect element, a magnetoresistance element, or a magnetotransistor.

5. The IC of claim 4, wherein the magnetoresistance element comprises at least one of a giant magnetoresistance (GMR) element, an anisotropic magnetoresistance element (AMR), a tunneling magnetoresistance (TMR) element, and a magnetic tunnel junction (MTJ).

6. The IC of claim 1, wherein the output signal is a current signal.

7. The IC of claim 1, wherein the frequency of the output signal indicates one or more faults in response to the frequency being at least two of less than the first frequency, greater than the fourth frequency, or between the third frequency and the second frequency.

8. The IC of claim 1, wherein the frequency of the output signal indicates one or more faults in response to the frequency being less than the first frequency, greater than the fourth frequency and between the third frequency and the second frequency.

9. An integrated circuit (IC) comprising:
a magnetic field sensor means to detect speed and direction of angular rotation of a rotating magnetic structure, the magnetic field sensor means comprising:
a means to sense changes in a magnetic field caused by rotation of the magnetic structure;
an output port configured to provide an output signal of the magnetic field sensor means, the frequency of the output signal indicating the speed,
wherein a frequency of the output signal being between a first frequency and a second frequency indicates the magnetic structure rotating in a first direction,
wherein the frequency of the output signal being between a third frequency and a fourth frequency indicates the magnetic structure rotating in a second direction opposite the first direction,
wherein the frequency of the output signal indicates one or more faults in response to the frequency being at least one of:
less than the first frequency,
greater than the fourth frequency, or
between the third frequency and the second frequency,
wherein the first frequency is less than the second frequency, the second frequency is less than the third frequency and the third frequency is less than the fourth frequency.

10. The IC of claim 9, wherein the magnetic structure is a ring magnet.

11. The IC of claim 9, wherein the fault indicating at least one of: a loose wire, malfunction of the IC, a gap between the magnetic structure and the IC being above or below a distance threshold or a temperature of the IC exceeds a temperature threshold.

12. The IC of claim 9, wherein the output signal is a current signal.

13. The IC of claim 9, wherein the frequency of the output signal indicates one or more faults in response to the frequency being at least two of less than the first frequency, greater than the fourth frequency, or between the third frequency and the second frequency.

14. The IC of claim 9, wherein the frequency of the output signal indicates one or more faults in response to the frequency being less than the first frequency, greater than the fourth frequency and between the third frequency and the second frequency.

15. A magnetic field sensor comprising:
at least two magnetic field sensing elements configured to sense changes in a magnetic field caused by rotation of a magnetic structure;
an output port configured to provide an output signal of the magnetic field sensor, the frequency of the output signal indicating a speed of rotation of the magnetic structure,
wherein a frequency of the output signal being between a first frequency and a second frequency indicates the magnetic structure rotating in a first direction,
wherein the frequency of the output signal being between a third frequency value and a fourth frequency indicates the magnetic structure rotating in a second direction opposite the first direction,
wherein the frequency of the output signal indicates one or more faults in response to the frequency being at least one of:
less than the first frequency,
greater than the fourth frequency, or
between the third frequency and the second frequency,
wherein the first frequency is less than the second frequency, the second frequency is less than the third frequency and the third frequency is less than the fourth frequency.

16. The magnetic field sensor of claim 15, wherein the magnetic structure is a ring magnet.

17. The magnetic field sensor of claim 15, wherein the fault indicating at least one of: a loose wire, malfunction of the IC, a gap between the magnetic structure and the IC being above or below a distance threshold or a temperature of the IC exceeds a temperature threshold.

18. The magnetic field sensor of claim 15, wherein at least one of the at least two magnetic field sensing elements comprises at least one of a Hall effect element, a magnetoresistance element, or a magnetotransistor.

19. The magnetic field sensor of claim 18, wherein the magnetoresistance element comprises at least one of a giant magnetoresistance (GMR) element, an anisotropic magnetoresistance element (AMR), a tunneling magnetoresistance (TMR) element, and a magnetic tunnel junction (MTJ).

20. The magnetic field sensor of claim 15, wherein the output signal is a current signal.

21. The magnetic field sensor of claim 15, wherein the frequency of the output signal indicates one or more faults in response to the frequency being at least two of less than the first frequency, greater than the fourth frequency, or between the third frequency and the second frequency.

22. The magnetic field sensor of claim 15, wherein the frequency of the output signal indicates one or more faults in response to the frequency being less than the first frequency, greater than the fourth frequency and between the third frequency and the second frequency.

* * * * *

UNITED STATES PATENT AND TRADEMARK OFFICE
CERTIFICATE OF CORRECTION

PATENT NO. : 10,571,301 B2
APPLICATION NO. : 15/655400
DATED : February 25, 2020
INVENTOR(S) : Michael C. Doogue et al.

It is certified that error appears in the above-identified patent and that said Letters Patent is hereby corrected as shown below:

In the Specification

Column 1, Line 41, delete "indicating" and replace with --indicates--.

Column 1, Line 47, delete "is diagram" and replace with --is a diagram--.

Column 1, Line 51, delete "is block" and replace with --is a block--.

Column 1, Line 57, delete "is block" and replace with --is a block--.

Column 1, Line 59, delete "is block" and replace with --is a block--.

Column 1, Line 62, delete "is block" and replace with --is a block--.

Column 1, Line 64, delete "is circuit" and replace with --is a circuit--.

Column 2, Line 1, delete "is circuit" and replace with --is a circuit--.

Column 2, Line 22, delete "of further" and replace with --of a further--.

Column 2, Line 24, delete "is block" and replace with --is a block--.

Column 8, Line 4, delete "SC, SC and SD" and replace with --SC and SD--.

Column 9, Line 32, delete "signal." and replace with --signal--.

Column 13, Line 51, delete "two of" and replace with --two of:--.

Column 15, Line 16, delete "two of" and replace with --two of:--.

Signed and Sealed this
Eighth Day of September, 2020

Andrei Iancu
*Director of the United States Patent and Trademark Office*